(12) United States Patent
Kwon et al.

(10) Patent No.: US 11,895,896 B2
(45) Date of Patent: Feb. 6, 2024

(54) DISPLAY DEVICE INCLUDING A SENSING ELECTRODE

(71) Applicant: SAMSUNG DISPLAY CO., LTD., Yongin-si (KR)

(72) Inventors: Ohjune Kwon, Hwaseong-si (KR); Jeongseok Lee, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 17/812,128

(22) Filed: Jul. 12, 2022

(65) Prior Publication Data
US 2023/0132929 A1    May 4, 2023

(30) Foreign Application Priority Data
Oct. 28, 2021 (KR) .......................... 10-2021-0145131

(51) Int. Cl.
*H10K 59/40* (2023.01)
*G06F 3/044* (2006.01)
*H10K 50/844* (2023.01)
*H10K 59/131* (2023.01)

(52) U.S. Cl.
CPC .......... *H10K 59/40* (2023.02); *G06F 3/0446* (2019.05); *H10K 50/844* (2023.02); *H10K 59/131* (2023.02)

(58) Field of Classification Search
CPC ...... G06F 3/0446; G06F 3/044; G06F 3/0445; H10K 59/40; H10K 59/131; H10K 50/844
See application file for complete search history.

(56) References Cited

U.S. PATENT DOCUMENTS

| | | | |
|---|---|---|---|
| 9,336,709 B2* | 5/2016 | Lin | H10K 59/131 |
| 9,627,637 B2 | 4/2017 | Kwon | |
| 10,886,339 B2* | 1/2021 | Won | G06F 3/0446 |
| 11,183,667 B2* | 11/2021 | Bang | H10K 59/40 |
| 11,294,489 B2* | 4/2022 | Lee | H10K 59/122 |
| 11,508,312 B2* | 11/2022 | Kim | G09G 3/3233 |
| 2017/0287381 A1* | 10/2017 | Park | G09G 3/2092 |
| 2021/0200363 A1* | 7/2021 | Lee | H10K 59/121 |
| 2021/0271336 A1 | 9/2021 | Yamanaka et al. | |
| 2023/0026822 A1* | 1/2023 | Wang | H01L 25/0753 |

FOREIGN PATENT DOCUMENTS

| | | |
|---|---|---|
| CN | 107785402 | 3/2018 |
| CN | 112425264 | 2/2021 |
| CN | 112799550 | 5/2021 |

\* cited by examiner

*Primary Examiner* — Sardis F Azongha
(74) *Attorney, Agent, or Firm* — F. CHAU & ASSOCIATES, LLC

(57) ABSTRACT

A display device includes a display panel and an input sensor. The display panel includes an encapsulation organic layer disposed inside a first line pattern. An organic pattern includes a first portion disposed outside of the first line pattern and a second portion disposed inside of the first line pattern and at least partially overlapping the encapsulation organic layer. The organic pattern supports a signal line of the input sensor.

22 Claims, 18 Drawing Sheets

DISPLAY DEVICE INCLUDING A SENSING ELECTRODE

This U.S. non-provisional patent application claims priority under 35 U.S.C. § 119 to Korean Patent Application No. 10-2021-0145131, filed on Oct. 28, 2021, the contents of which are hereby incorporated by reference in its entirety.

TECHNICAL FIELD

The present disclosure relates to a display device and, more particularly, to a display device including a sensing electrode.

DISCUSSION OF THE RELATED ART

Various display devices applied to multimedia devices, such as televisions, mobile phones, tablet computers, navigation devices, and portable game devices, are being developed. The multimedia devices often utilize a keyboard, mouse, or similar device as their input device. In addition, some display devices have been configured to include an input sensor, such as a touch panel.

SUMMARY

A display device includes a display panel including a display area and a peripheral area at least partially surrounding the display area. A sensing electrode is disposed on the display panel and the sensing electrode at least partially overlaps the display area. A signal line is disposed on the display panel and the signal line at least partially overlaps the peripheral area and is connected to the sensing electrode. An organic pattern is disposed on the display panel and at least partially overlaps the signal line. The display panel includes a pixel at least partially overlapping within the display area. A first line pattern at least partially overlaps the peripheral area. A first encapsulation inorganic layer is disposed in both the display area and the peripheral area and at least partially overlaps both the first line pattern and the pixel. An encapsulation organic layer is disposed on the first encapsulation inorganic layer and is disposed inside of the first line pattern. A second encapsulation inorganic layer is disposed on the encapsulation organic layer and at least partially overlaps both the display area and the peripheral area. The second encapsulation inorganic layer is in contact with the first encapsulation inorganic layer in the peripheral area. The organic pattern includes a first portion disposed outside of the first line pattern and a second portion disposed inside of the first line pattern and at least partially overlapping the encapsulation organic layer.

The second portion may have a size that is smaller than a size of the first portion.

The first portion may have an average thickness that is greater than an average thickness of the second portion.

The display panel may further include a second line pattern disposed outside of the first line pattern.

A portion of the encapsulation organic layer adjacent to the display area in the peripheral area may have a thickness that is greater than a thickness of a portion of the encapsulation organic layer that is farther away from the display area.

The first line pattern may extend in a first direction. The signal line may include a first line portion extending in the first direction and a second line portion extending from the first line portion in a second direction crossing the first direction. The second line portion may at least partially overlap the second portion.

The first line portion may be disposed outside of the encapsulation organic layer.

The first line pattern may extend in the first direction, the first portion may extend in the first direction, and the first portion may include a plurality of curved surface patterns arranged in the first direction and providing a convex curved surface.

The second portion may be provided in plural, and the second portions may be spaced apart from each other in the first direction.

The first line pattern may extend in the first direction. The first portion may extend in the first direction. The first portion may include a plurality of valley areas defined therein and spaced apart from each other in the first direction. Each of the valley areas may extend in the second direction crossing the first direction.

The organic pattern may further include a dye or a pigment.

The organic pattern may be in contact with the second encapsulation inorganic layer.

The display device may further include a first inorganic layer disposed on the second encapsulation inorganic layer and a second inorganic layer disposed on the first inorganic layer. The organic pattern may be disposed between the first inorganic layer and the second inorganic layer.

The display device may further include a first inorganic layer disposed on the second encapsulation inorganic layer and a second inorganic layer disposed on the first inorganic layer. The signal line may include a line of a first layer disposed between the first inorganic layer and the second inorganic layer and a line of a second layer disposed on the second inorganic layer and connected to the line of the first layer via a contact hole defined through the second inorganic layer.

The display area may include a first display area, a second display area disposed proximate to the first display area, and a third display area proximate to the second display area. The pixel may include a first pixel including a first light emitting element disposed in the first display area and a first pixel circuit electrically connected to the first light emitting element and disposed in the first display area, a second pixel including a second light emitting element disposed in the second display area and a second pixel circuit electrically connected to the second light emitting element and disposed in the second display area, and a third pixel including a third light emitting element disposed in the third display area and a third pixel circuit electrically connected to the third light emitting element and disposed in the second display area.

The display panel may further include a scan driving circuit providing a scan signal to the first pixel, the second pixel, and the third pixel. The scan driving circuit may at least partially overlap the third display area. The third light emitting element may at least partially overlap the scan driving circuit.

The first line pattern may extend in the first direction. The third light emitting element may be provided in plural. The second portion may be disposed between a pair of third light emitting elements that are spaced apart from each other and adjacent to each other in the first direction.

The first display area may have a resolution that is greater than a resolution of the second display area or a resolution of the third display area.

A size of a light emission area of a first color of the second light emitting element may be greater than a size of a light emission area of the first color of the first light emitting element.

A display device includes a display panel including a display area and a peripheral area at least partially surrounding the display area. A sensing electrode is disposed on the display panel and at least partially overlaps the display area. A signal line is disposed on the display panel, at least partially overlaps the peripheral area, and is connected to the sensing electrode. An organic pattern is disposed on the display panel and supports the signal line. The display panel includes a light emitting element in the display area, a first encapsulation inorganic layer disposed in both the display area and the peripheral area and at least partially overlapping the light emitting element. An encapsulation organic layer is disposed on the first encapsulation inorganic layer and has an inclined surface. A second encapsulation inorganic layer is disposed on the encapsulation organic layer and is in contact with the first encapsulation inorganic layer in the peripheral area. The organic pattern includes a first portion that does not overlap the encapsulation organic layer and a second portion at least partially overlapping the inclined surface of the encapsulation organic layer.

A display device includes a display panel having a display area, a non-display area proximate to the display area, and a raised dam disposed within the non-display area and having a substantially closed loop shape. A sensing electrode is disposed on the display area of the display panel. A sensing electrode signal line is electrically connected to the sensing electrode. The sensing electrode is disposed beyond the closed loop shape of the raised dam.

An organic pattern may be disposed on the display panel and may at least partially overlap the signal line.

A first encapsulation inorganic layer may at least partially overlap the raised dam. An encapsulation organic layer may be disposed on the first encapsulation inorganic layer and within the raised dam. A second encapsulation inorganic layer may be disposed on the encapsulation organic layer and may contact the first encapsulation inorganic layer in the non-display area.

The organic pattern may include a first portion disposed beyond the raised dam and a second portion disposed within the substantially closed loop shape of the raised dam and at least partially overlapping the encapsulation organic layer.

BRIEF DESCRIPTION OF THE DRAWINGS

The above and other aspects of the present disclosure will become readily apparent by reference to the following detailed description when considered in conjunction with the accompanying drawings wherein.

DETAILED DESCRIPTION

Figure 1A:
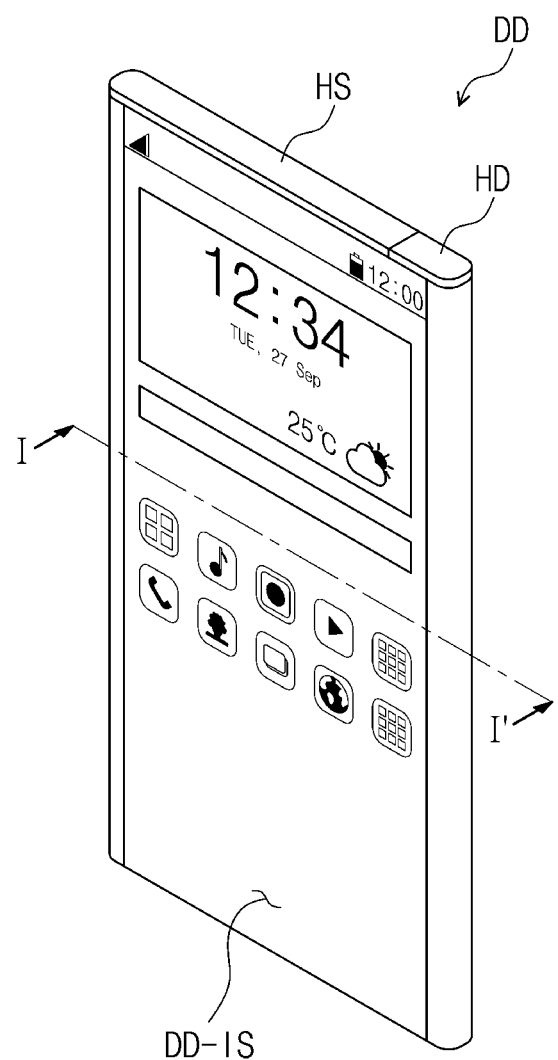
FIG. 1A is a perspective view of a display device according to an embodiment of the present disclosure.

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals may refer to like elements throughout the specification and the drawings. In the drawings, the thickness, ratio, and dimension of components may be exaggerated for effective description of the technical content. However, it is to be understood that the relative sizes, angles, and disposition of the various elements, as shown in the figures, is intended to represent at least one embodiment of the present disclosure. As used herein, the term "and/or" may include any and all combinations of one or more of the associated listed items.

It will be understood that, although the terms first, second, etc. may be used herein to describe various elements, these elements should not necessarily be limited by these terms. These terms may be used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, the present disclosure will be explained in detail with reference to the accompanying drawings.

Figure 1B:
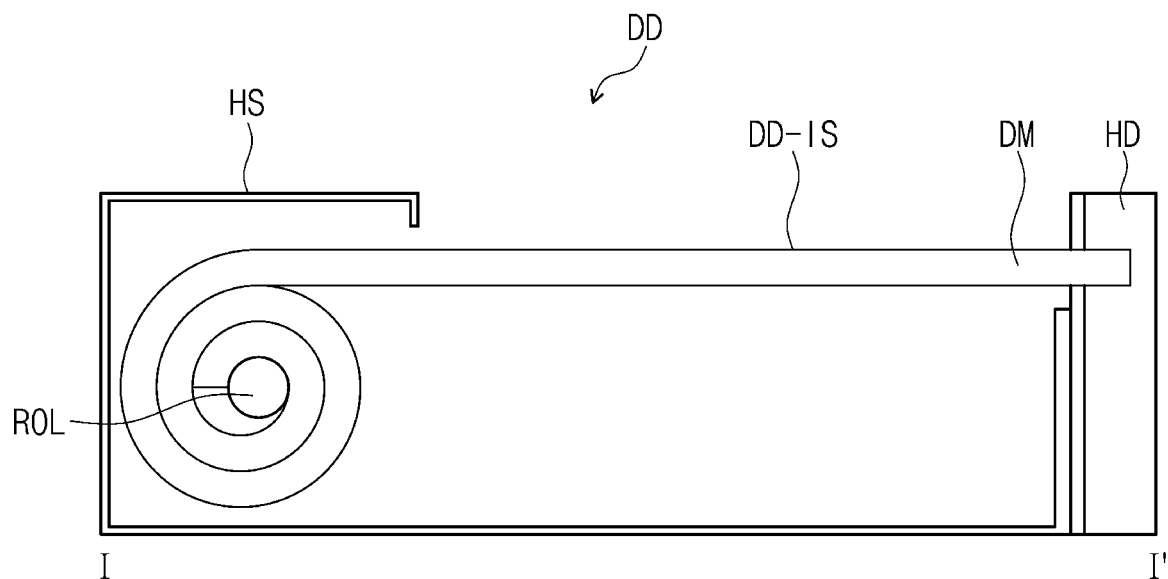
FIG. 1B is a cross-sectional view of a display device taken along a line I-I' of FIG. 1A.
Figure 1B:
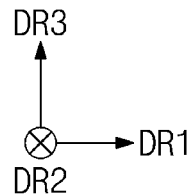
Figure 1C:
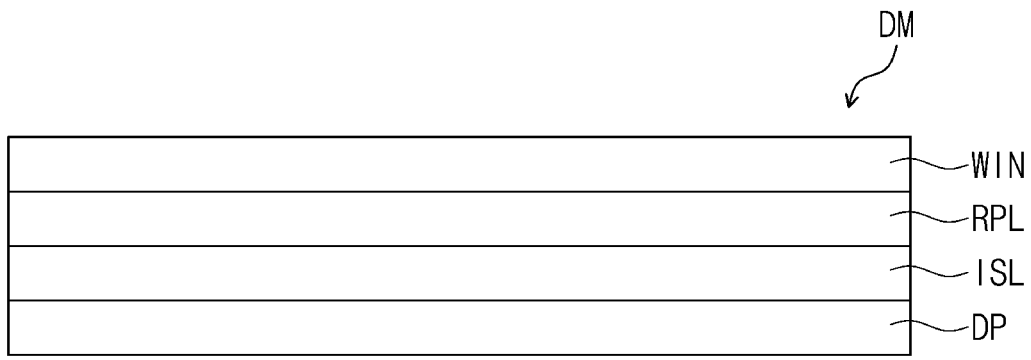
FIG. 1C is a cross-sectional view of a display module according to an embodiment of the present disclosure.

FIG. 1A is a perspective view of a display device DD according to an embodiment of the present disclosure. FIG. 1B is a cross-sectional view of the display device DD taken along a line I-I' of FIG. 1A. FIG. 1C is a cross-sectional view of a display module DM according to an embodiment of the present disclosure.

Referring to FIGS. 1A and 1B, the display device DD may include the display module DM, a roller ROL, a holder HD, and a housing HS. The display device DD may further include additional components.

FIGS. 1A and 1B show the display device DD in a state (hereinafter, referred to as a first state) in which the display module DM is accommodated (e.g., rolled-up) within the housing HS. FIG. 1B shows the display device DD in the first state in which a portion of the display module DM is exposed without being covered by the housing HS as an example, however, the present disclosure is not necessarily limited thereto or thereby. According to an embodiment, the display module DM may be completely inserted into the housing HS, with no portion thereof being exposed, when in the first state.

In a state (hereinafter, referred to as a second state) in which the display module DM is completely unfolded, the display module DM exposed without being covered by the housing HS may provide a flat display surface DD-IS. The display surface DD-IS may be parallel to a plane defined by a first directional axis DR1 and a second directional axis DR2. A bezel area may be defined in a front surface of the display module DM adjacent to the display surface DD-IS. An image is not displayed through the bezel area. A third directional axis DR3 may indicate a normal line direction of the display surface DD-IS, i.e., a thickness direction of the display module DM. Front (or upper) and rear (or lower) surfaces of each member are distinguished from each other by the third directional axis DR3.

Referring to FIG. 1C, the display module DM may include a display panel DP, an input sensor ISL, an anti-reflective layer RPL, and a window WIN. The display panel may have a configuration that substantially generates the image. The display panel DP may be a light emitting type display panel. For example, the display panel DP may be an organic light emitting display panel, an inorganic light emitting display panel, a micro-LED display panel, or a nano-LED display panel.

The input sensor ISL may be disposed on the display panel DP. The input sensor ISL may be disposed directly on the display panel DP through successive processes. In this case, the expression "the input sensor ISL is disposed directly on the display panel DP" may mean that no intervening elements are present between the input sensor ISL and the display panel DP. For example, a separate adhesive member might not be disposed between the input sensor ISL and the display panel DP.

The anti-reflective layer RPL may be disposed directly on the input sensor ISL. The anti-reflective layer RPL may reduce a reflectance with respect to an external light incident into the display device DD from the outside. The anti-reflective layer RPL may be formed on the input sensor ISL through successive processes. The anti-reflective layer RPL may include color filters. The color filters may have a predetermined arrangement. As an example, the arrangement of the color filters may be determined by taking into account emission colors of pixels included in the display panel DP. The anti-reflective layer RPL may further include a black matrix disposed adjacent to the color filters.

According to an embodiment of the present disclosure, the anti-reflective layer RPL may include a retarder and a polarizer. In this case, an adhesive layer may be disposed between the anti-reflective layer RPL and the input sensor ISL.

The window WIN may be disposed directly on the anti-reflective layer RPL or may be coupled to the anti-reflective layer RPL by an adhesive layer. The window WIN may be formed by coating a synthetic resin on the anti-reflective layer RPL or by attaching a synthetic resin film to the anti-reflective layer RPL. The window WIN may include a thin film glass. The window WIN may include a bezel pattern defining the bezel area. The bezel pattern may be, but is not necessarily limited to being, a light blocking pattern that covers a structure thereunder.

Figure 2:
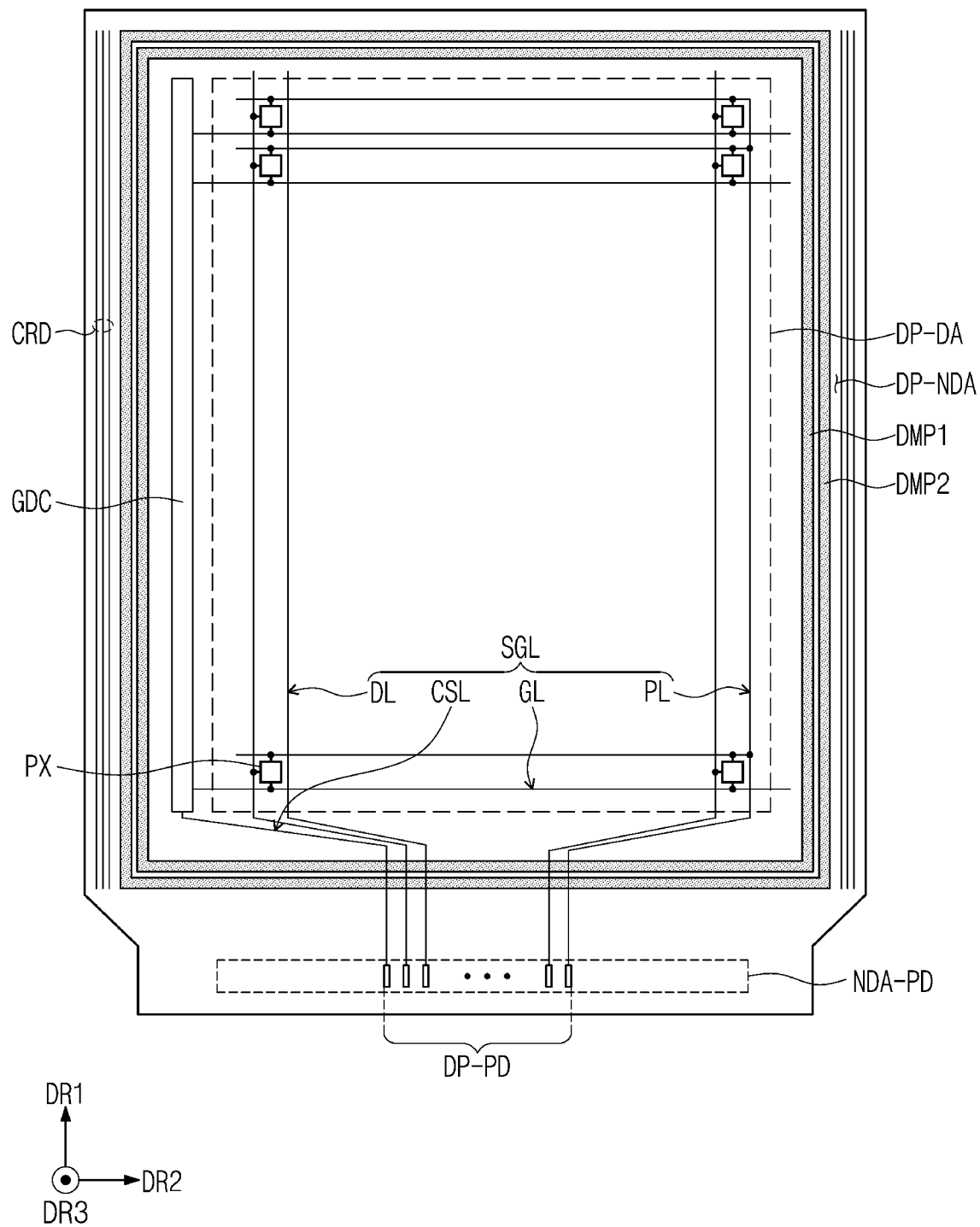
FIG. 2 is a plan view of a display panel according to an embodiment of the present disclosure.
Figure 3:
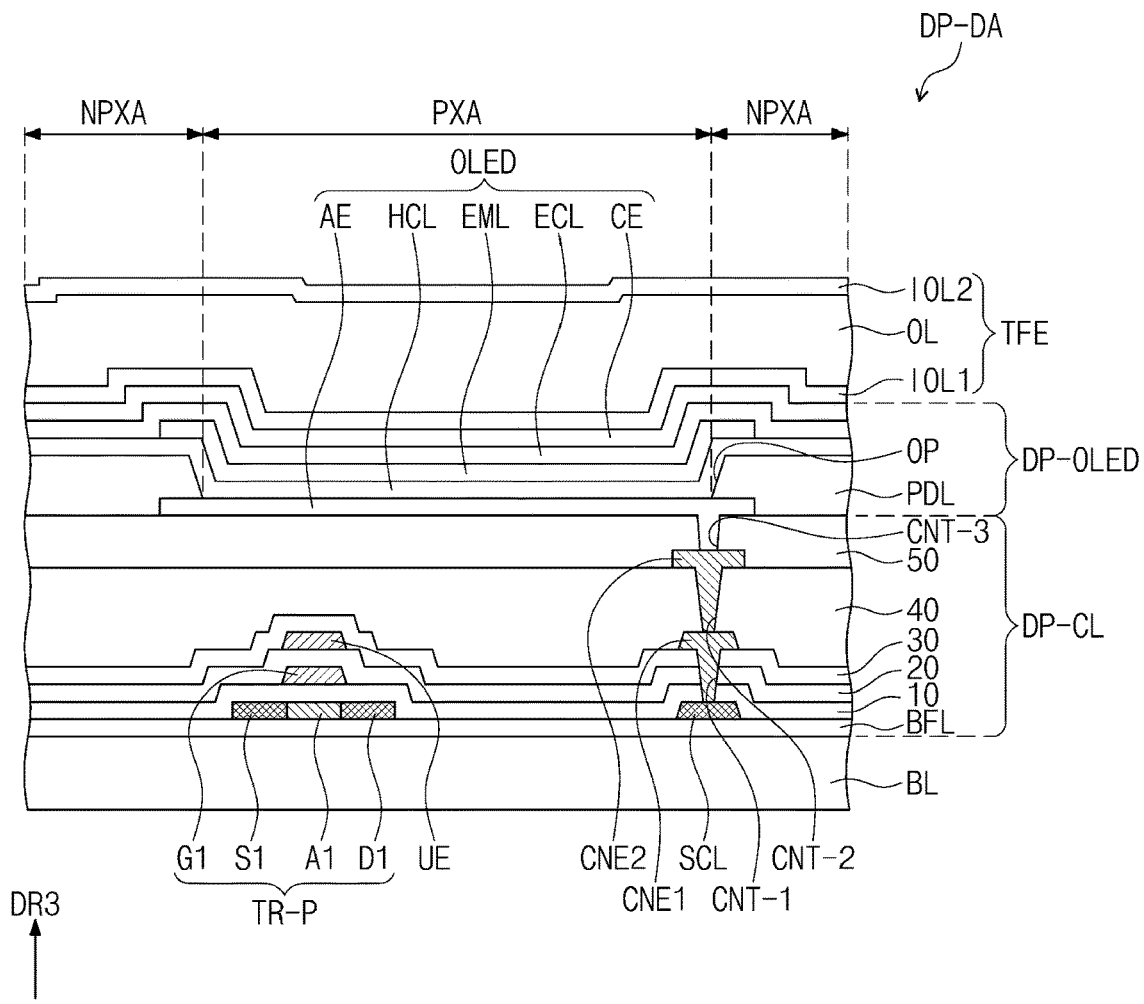
FIG. 3 is a cross-sectional view of a display panel according to an embodiment of the present disclosure.

FIG. 2 is a plan view of the display panel DP according to an embodiment of the present disclosure, and FIG. 3 is a cross-sectional view of the display panel DP according to an embodiment of the present disclosure.

Referring to FIG. 2, the display panel DP may include a display area DP-DA and a peripheral area DP-NDA adjacent to the display area DP-DA. In an embodiment, the peripheral area DP-NDA may be defined along an edge of the display area DP-DA. The peripheral area DP-NDA may correspond to the bezel area of the display device and may be a non-display area in which the image is not displayed.

The display panel DP may include a scan driving circuit GDC, a plurality of signal lines SGL, and a plurality of pixels PX. The pixels PX may be arranged in the display area DP-DA. Each of the pixels PX may include a light emitting element and a pixel circuit or a pixel driving circuit connected to the light emitting element.

The scan driving circuit GDC may generate a plurality of scan signals and may sequentially output the scan signals to a plurality of scan lines GL described later. The scan driving circuit GDC may further output a control signal to the driving circuit of the pixels PX. The scan driving circuit GDC may include a plurality of thin film transistors formed through the same processes, e.g., a low temperature polycrystalline silicon (LTPS) process or a low temperature polycrystalline oxide (LTPO) process, as the driving circuit of the pixels PX.

The signal lines SGL may include the scan lines GL, data lines DL, a power line PL, and a control signal line CSL. Each of the scan lines GL may be connected to a corresponding pixel PX among the pixels PX, and each of the data lines DL may be connected to a corresponding pixel PX among the pixels PX. The power line PL may be connected to the pixels PX. The control signal line CSL may provide control signals to the scan driving circuit GDC. The display panel DP may include signal pads DP-PD connected to ends of the signal lines SGL. An area where the signal pads DP-PD are disposed in the peripheral area DP-NDA may be defined as a pad area NDA-PD. A data driving circuit connected to the signal pads DP-PD may be mounted on the display panel DP.

The display panel DP may include line patterns DMP1 and DMP2 that might be raised above a top surface of the display panel DP. The raised line patterns DMP1 and DMP2 may act as dams to prevent a liquid organic material from overflowing in an inkjet process of display panel DP (hereinafter, referred to as a dam function). Two line patterns DMP1 and DMP2 are shown as a representative example however, additional line patterns may be present or only a single line pattern might be used.

The two line patterns DMP1 and DMP2 may be disposed in the peripheral area DP-NDA and may partially or fully surround the display area DP-DA. The line patterns DMP1 and DMP2 may have a closed line shape as shown in FIG. 2 (e.g., a rectangular frame shape), however, they might have alternative shapes. Each of the line patterns DMP1 and DMP2 may include a portion disposed at one side of the display area DP-DA and a portion disposed at the other side of the display area DP-DA in the second direction DR2. The line patterns DMP1 and DMP2 may include a portion that is parallel to the pad area NDA-PD.

A crack sensing pattern CRD may be disposed outside of the line patterns DMP1 and DMP2 (e.g., beyond the line patterns DMP1 and DMP2 with respect to the display area DP-DA). The crack sensing patterns CRD disposed at opposite sides of the display area DP-DA are shown as a representative example. According to an embodiment, the crack sensing pattern CRD may be omitted.

FIG. 3 shows a cross-section of the display panel DP in the display area DP-DA. The display panel DP may include a circuit element layer DP-CL, a display element layer DP-OLED, and a thin film encapsulation layer TFE, which are sequentially stacked on a base layer BL.

The circuit element layer DP-CL may include at least one insulating layer and a circuit element. The circuit element may include a signal line and a pixel circuit. The circuit element layer DP-CL may be formed by a coating or depositing process to form an insulating layer, a semiconductor layer, and a conductive layer and a photolithography process to pattern the insulating layer, the semiconductor layer, and the conductive layer.

A buffer layer BFL may include a plurality of inorganic layers stacked one on another. A semiconductor pattern may be disposed on the buffer layer BFL. The buffer layer BFL may increase a coupling force between the base layer BL and the semiconductor pattern.

The semiconductor pattern may include polysilicon, however, the present disclosure is not necessarily limited thereto or thereby. The semiconductor pattern may include an amorphous silicon or metal oxide. FIG. 3 shows a portion of the semiconductor pattern, and the semiconductor pattern may be arranged with a specific rule over the pixels PX (refer to FIG. 2).

The semiconductor pattern may have different electrical properties depending on whether it is doped or not or whether it is doped with an N-type dopant or a P-type dopant. The semiconductor pattern may include a first region A1 having a low doping concentration and low electrical conductivity and second regions S1 and D1 having relatively high doping concentration and a relatively high electrical conductivity. One second region S1 may be disposed at one side of the first region A1, and the other second region D2 may be disposed at the other side of the first region A1. The second regions S1 and D1 may be doped with the N-type dopant or the P-type dopant. A P-type transistor may include a doped region doped with the P-type dopant. The first region A1 may be a non-doped region or may be doped at a concentration lower than that of the second regions S1 and D1.

The second regions S1 and D1 may substantially serve as an electrode or a signal transmission area. The one second area S1 may correspond to a source of a transistor, and the other second area D1 may correspond to a drain of the transistor. FIG. 3 shows a portion of a signal transmission area SCL formed of the semiconductor pattern. The signal transmission area SCL may be connected to the drain of the transistor TR-P. The pixel circuit may include a plurality of transistors and at least one capacitor. FIG. 3 shows one transistor TR-P as a component of the pixel circuit, however, the pixel circuit may have additional transistors.

A first insulating layer 10 may be disposed on the buffer layer BFL. The first insulating layer 10 may commonly overlap the pixels PX (refer to FIG. 2) and may cover the semiconductor pattern. The first insulating layer 10 may be disposed in the display area DP-DA and the peripheral area DP-NDA (refer to FIG. 2).

The first insulating layer 10 may be an inorganic layer and may have a single-layer or multi-layer structure. The first insulating layer 10 may include silicon oxide, silicon oxynitride, silicon nitride, zirconium oxide, aluminum oxide, titanium oxide, and/or hafnium oxide. Not only the first insulating layer 10 but also an insulating layer of the circuit element layer DP-CL described later may be an inorganic layer corresponding to one of the above-mentioned materials.

A gate G1 may be disposed on the first insulating layer 10. The gate G1 may include a plurality of metal layers. The gate G1 may at least partially overlap the first region A1. The gate G1 may be used as a mask in a process of doping the semiconductor pattern.

A second insulating layer 20 may be disposed on the first insulating layer 10 and may cover the gate G1. The second insulating layer 20 may commonly overlap the pixels PX (refer to FIG. 2). An upper electrode UE may be disposed on the second insulating layer 20. The upper electrode UE may at least partially overlap the gate G1. The upper electrode UE may include a plurality of metal layers. According to an embodiment, the upper electrode UE may be omitted.

A third insulating layer 30 may be disposed on the second insulating layer 20 and may cover the upper electrode UE. A first connection electrode CNE1 may be disposed on the third insulating layer 30. The first connection electrode CNE1 may be connected to the signal transmission area SCL via a contact hole CNT-1 defined through the first, second, and third insulating layers 10, 20, and 30.

A fourth insulating layer 40 may be disposed on the third insulating layer 30. A fifth insulating layer 50 may be disposed on the fourth insulating layer 40. The fourth and fifth insulating layers 40 and 50 may each be an organic layer. A second connection electrode CNE2 may be disposed on the fourth insulating layer 40. The second connection electrode CNE2 may be connected to the first connection electrode CNE1 via a contact hole CNT-2 defined through the fourth insulating layer 40. A connection relationship between the signal transmission area SCL and a first electrode AE via the first connection electrode CNE1 and the second connection electrode CNE2 is merely an example, and a connection relationship between the pixel circuit and the light emitting element is not necessarily limited to the illustrated structure.

The light emitting element OLED may be disposed on the fifth insulating layer 50. The first electrode AE (or an anode) may be disposed on the fifth insulating layer 50. The first electrode AE may be connected to the second connection electrode CNE2 via a contact hole CNT-3 defined through the fifth insulating layer 50. A pixel definition layer PDL may be provided with an opening OP defined therethrough. At least a portion of the first electrode AE may be exposed through the opening OP of the pixel definition layer PDL. The pixel definition layer PDL may be an organic layer.

As shown in FIG. 3, the display area DP-DA may include a light emitting area PXA and a non-light-emitting area NPXA that is adjacent to the light emitting area PXA. The non-light-emitting area NPXA may surround the light emitting area PXA. In an embodiment, the light emitting area PXA may correspond to the portion of the first electrode AE, which is exposed through the opening OP.

A hole control layer HCL may be commonly disposed in the light emitting area PXA and the non-light-emitting area NPXA. The hole control layer HCL may include a hole transport layer and may further include a hole injection layer. A light emitting layer EML may be disposed on the hole control layer HCL. The light emitting layer EML may be disposed in an area corresponding to the opening OP. For example, the light emitting layer EML may be disposed separately in each of the pixels PX (refer to FIG. 2) after being divided into portions.

An electron control layer ECL may be disposed on the light emitting layer EML. The electron control layer ECL may include an electron transport layer and may further include an electron injection layer. The hole control layer HCL and the electron control layer ECL may be commonly disposed over the pixels using an open mask. A second electrode CE (or a cathode) may be disposed on the electron control layer ECL. The second electrode CE may have an integral shape (e.g., may be formed of a single uninterrupted structure) and may be commonly disposed over the pixels PX (refer to FIG. 2). As shown in FIG. 3, the thin film encapsulation layer TFE may be disposed on the second electrode CE.

The thin film encapsulation layer TFE may include a first inorganic layer IOL1 (or a first encapsulation inorganic layer), an organic layer OL (or an encapsulation organic layer), and a second inorganic layer IOL2 (or a second encapsulation inorganic layer). The first inorganic layer IOL1 and the second inorganic layer IOL2 may protect the display element layer DP-OLED from ambient moisture and oxygen, and the organic layer OL may protect the display element layer DP-OLED from a foreign substance such as dust particles.

Figure 4:
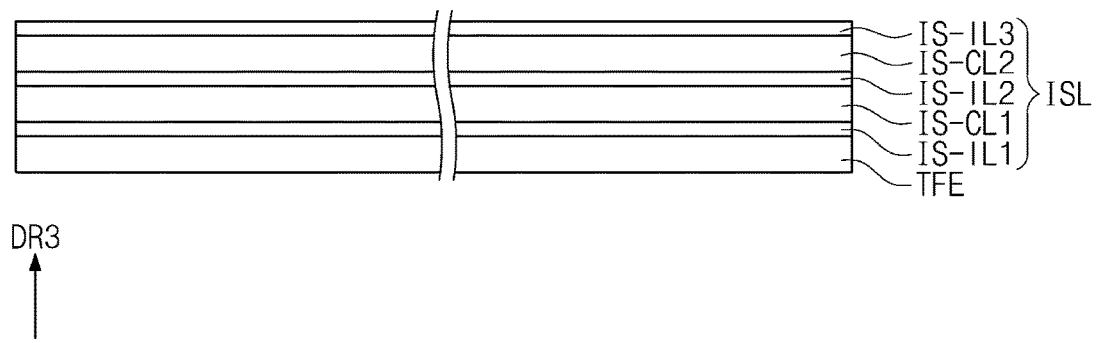
FIG. 4 is a cross-sectional view of an input sensor according to an embodiment of the present disclosure.

FIG. 4 is a cross-sectional view of the input sensor ISL according to an embodiment of the present disclosure. The input sensor ISL may obtain coordinate information of the external input. The input sensor ISL may have a multi-layer structure. The input sensor ISL may include a conductive layer having a single-layer or multi-layer structure. The input sensor ISL may include an insulating layer having a single-layer or multi-layer structure. The input sensor ISL may sense the external input using a capacitive method. In the present disclosure, an operation method of the input sensor ISL is not necessarily limited to the approach described herein. According to an embodiment, the input sensor ISL may sense the external input using an electromagnetic induction method or a pressure sensing method.

As shown in FIG. 4, the input sensor ISL may include a first insulating layer IS-IL1, a first conductive pattern layer IS-CL1, a second insulating layer IS-IL2, a second conductive pattern layer IS-CL2, and a third insulating layer IS-IL3. Each of the first and second insulating layers IS-IL1 and IS-IL2 may include at least one inorganic layer. The first insulating layer IS-IL1 may be disposed directly on the thin film encapsulation layer TFE. According to an embodiment, the first insulating layer IS-IL1 and/or the third insulating layer may be omitted.

Each of the first and second insulating layers IS-IL1 and IS-IL2 may include silicon oxide, silicon oxynitride, silicon nitride, zirconium oxide, aluminum oxide, titanium oxide, and/or hafnium oxide. The third insulating layer IS-IL3 may include an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and/or a perylene-based resin. According to an embodiment, the third insulating layer IS-IL3 is not necessarily limited to the organic layer, and the third insulating layer IS-IL3 may include an inorganic layer or may be an adhesive layer.

Each of the first conductive pattern layer IS-CL1 and the second conductive pattern layer IS-CL2 may have a plurality of conductive patterns. The conductive patterns may have a single-layer structure or a multi-layer structure including multiple layers stacked in the third directional axis DR3. The conductive pattern having the multi-layer structure may include two or more layers of transparent conductive layers and metal layers. The conductive pattern having the multi-layer structure may include metal layers containing different metals from each other. The transparent conductive layer may include indium tin oxide (ITO), indium zinc oxide (IZO), zinc oxide (ZnO), indium tin zinc oxide (ITZO), PEDOT, metal nanowire, and/or graphene. The metal layer may include molybdenum, silver, titanium, copper, aluminum, and/or alloys thereof.

Figure 5A:
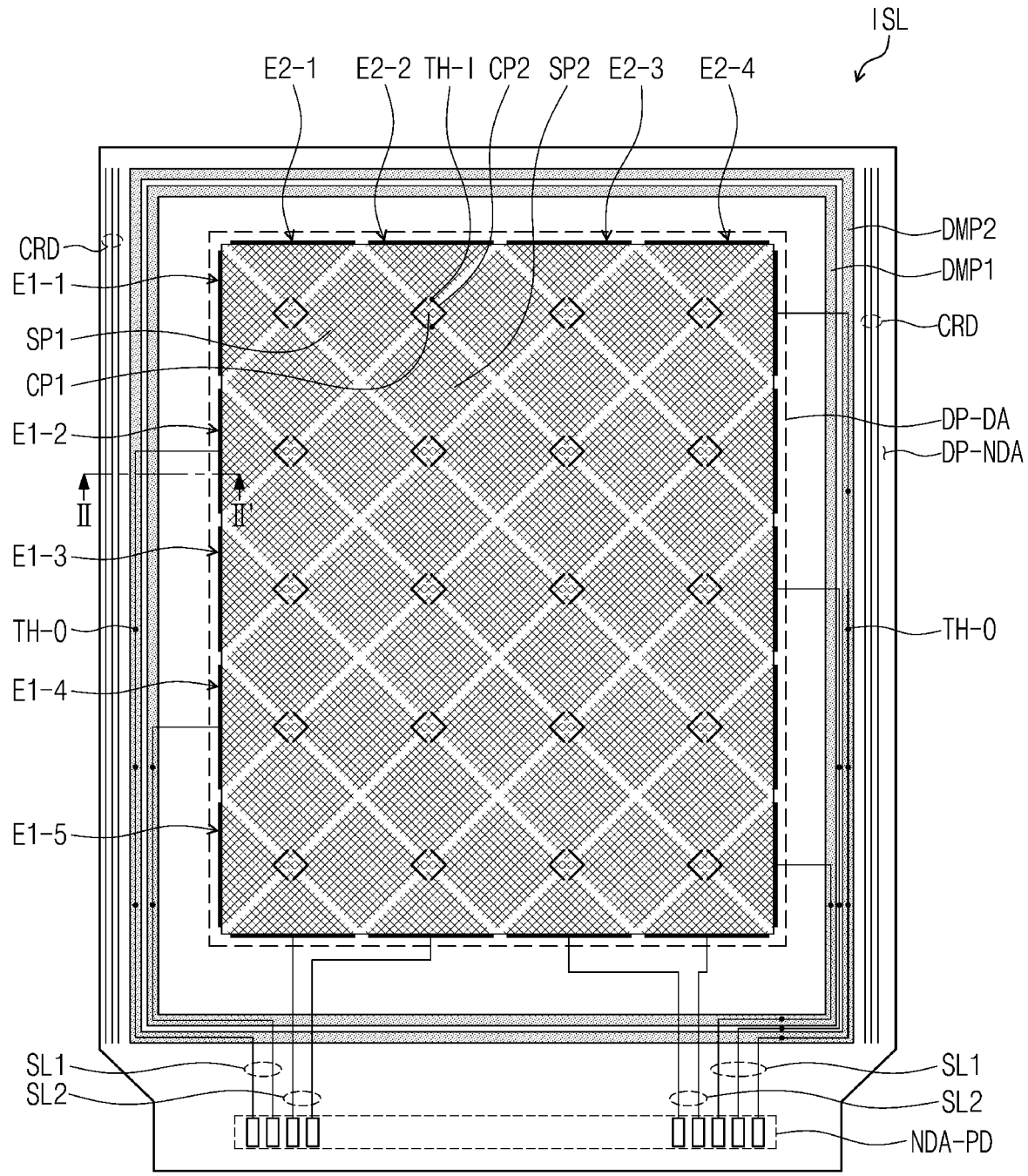
FIG. 5A is a plan view of an input sensor according to an embodiment of the present disclosure.
Figure 5B:
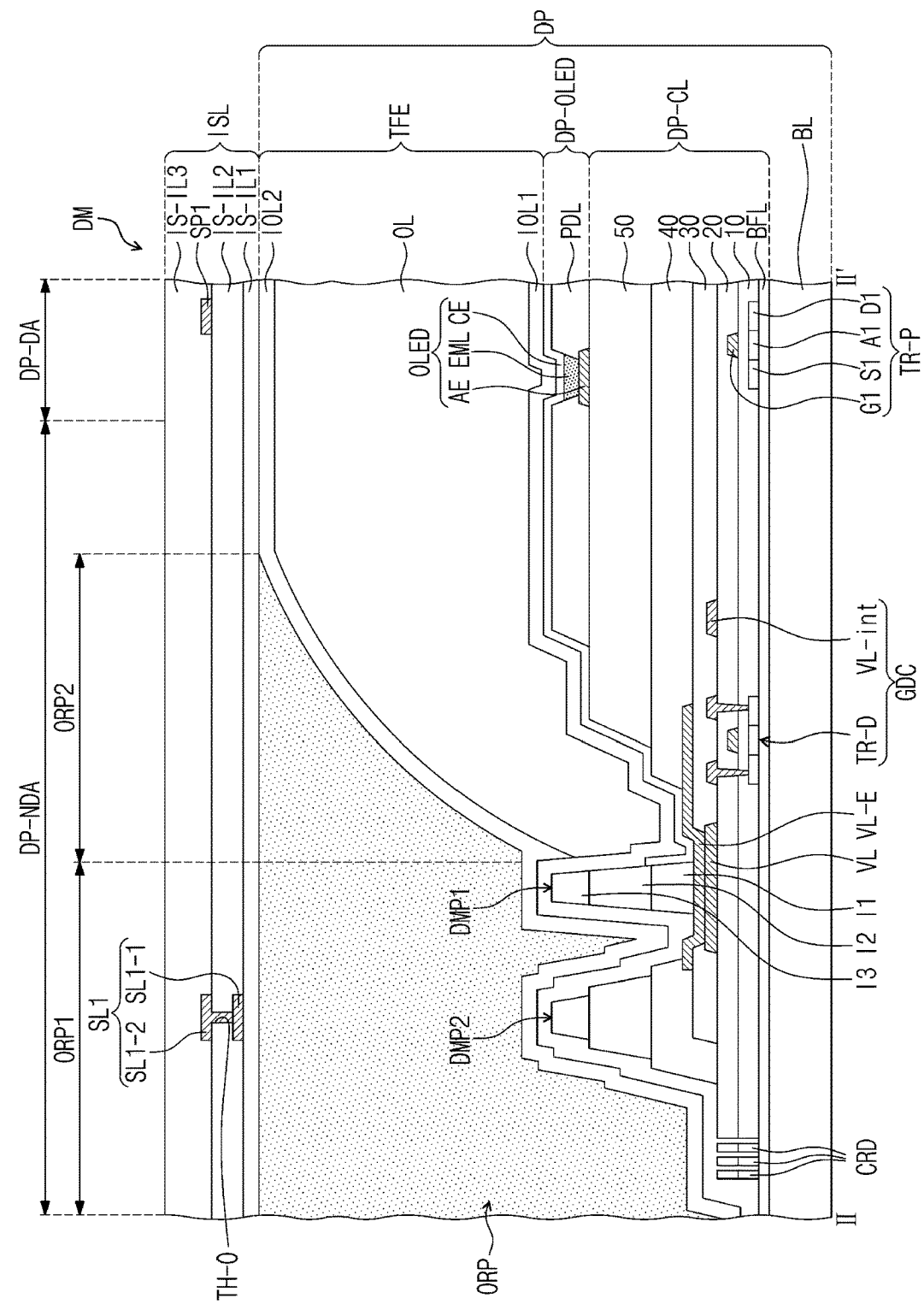
FIG. 5B is a cross-sectional view of a display module taken along a line II-II' of FIG. 5A.
Figure 5C:
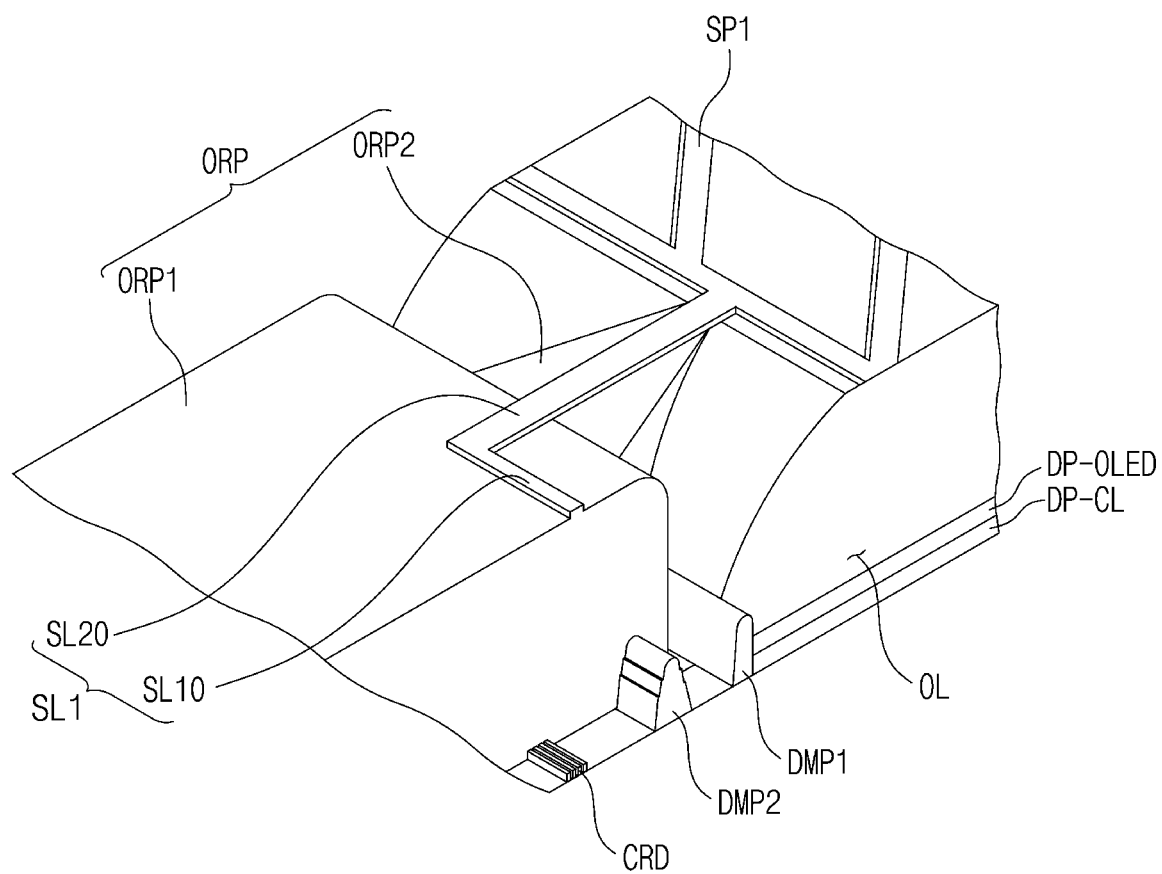
FIG. 5C is a partial perspective view of an organic pattern and a signal line.
Figure 5C:
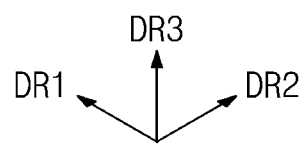

FIG. 5A is a plan view of the input sensor ISL according to an embodiment of the present disclosure. FIG. 5B is a cross-sectional view of the display module DM taken along a line II-II' of FIG. 5A. FIG. 5C is a partial perspective view of an organic pattern ORP and a signal line SL1.

Referring to FIG. 5A, the input sensor ISL may include a sensing electrode and a signal line connected to the sensing electrode. In an embodiment, the sensing electrode may include first electrodes E1-1 to E1-5 and second electrodes E2-1 to E2-4 insulated from the first electrodes E1-1 to E1-5 while crossing the first electrodes E1-1 to E1-5. The first electrodes E1-1 to E1-5 and the second electrodes E2-1 to E2-4 may be arranged in the display area DP-DA.

The signal line may include first signal lines SL1 connected to the first electrodes E1-1 to E1-5 and second signal lines SL2 connected to the second electrodes E2-1 to E2-4. The first signal lines SL1 and the second signal lines SL2 may at least partially overlap the peripheral area DP-NDA. One of the first signal lines SL1 and the second signal lines SL2 may apply a transmission signal from an external circuit to corresponding electrodes to sense the external input, and the other one of the first signal lines SL1 and the second signal lines SL2 may apply a variation in capacitance between the first electrodes E1-1 to E1-5 and the second electrodes E2-1 to E2-4 to the external circuit as a reception signal.

Among the first signal lines SL1, first signal lines connected to one side of a corresponding first electrode and first signal lines connected to the other side of the corresponding first electrode may be disposed such that the display area DP-DA is disposed therebetween. As the first signal lines SL1 are divided and disposed at both sides of the display area DP-DA, a size of the peripheral area DP-NDA may be reduced. In an embodiment, the first signal line SL1 is connected to only one side of the first electrodes E1-1 to E1-5, however, the present disclosure is not necessarily limited thereto or thereby. According to an embodiment, the signal line may be connected to both ends (e.g., opposite ends) of the first electrodes E1-1 to E1-5.

Each of the first signal lines SL1 and the second signal lines SL2 may include a line of a first layer and a line of a second layer. The line of the first layer may be formed from the first conductive pattern layer IS-CL1 of FIG. 4, and the line of the second layer may be formed from the second conductive pattern layer IS-CL2 of FIG. 4. FIG. 5A shows a contact hole TH-O connects the line of the first layer and the line of the second layer as a representative example. The contact hole TH-O may be defined through the second insulating layer IS-IL2 (refer to FIG. 4).

Each of the first electrodes E1-1 to E1-5 and the second electrodes E2-1 to E2-4 may have a mesh shape in which a plurality of openings is defined. Each of the first electrodes E1-1 to E1-5 and the second electrodes E2-1 to E2-4 may include conductive lines that define the openings. The openings may correspond to the light emitting area PXA (refer to FIG. 3) of the display panel DP. The second electrodes E2-1 to E2-4 may be insulated from the first electrodes E1-1 to E1-5 while crossing the first electrodes E1-1 to E1-5. One of the first electrodes E1-1 to E1-5 and the second electrodes E2-1 to E2-4 may have an integral shape. In an embodiment, the first electrodes E1-1 to E1-5 having the integral shape are shown as a representative example. The first electrodes E1-1 to E1-5 may include sensing portions SP1 and intermediate portions CP1.

Each of the second electrodes E2-1 to E2-4 may include sensing patterns SP2 and bridge patterns CP2 (or connection patterns). Two sensing patterns SP2 adjacent to each other may be connected to two bridge patterns CP2, however, the number of the bridge patterns CP2 is not necessarily limited to two. The bridge patterns CP2 may be formed by patterning the first conductive pattern layer IS-CL1 shown in FIG. 4, and the first electrodes E1-1 to E1-5 and the sensing patterns SP2 may be formed by patterning the second conductive pattern layer IS-CL2 shown in FIG. 4.

The line patterns DMP1 and DMP2 and the crack sensing pattern CRD are shown in FIG. 5A to indicate relative positions of the line patterns DMP1 and DMP2 and the crack sensing pattern CRD with respect to the input sensor ISL.

FIG. 5B shows a cross-section taken along a line II-II' of FIG. 5A. The cross-section of the display panel DP corresponding to the display area DP-DA is described with reference to FIG. 4, and so corresponding elements of FIG. 5B may be understood to be at least similarly arranged. The light emitting element OLED of FIG. 4 is briefly illustrated compared to the light emitting element OLED of FIG. 3. The sensing portion SP1 may be disposed on the thin film encapsulation layer TFE in the display area DP-DA. The sensing portion SP1 may be disposed between the second insulating layer IS-IL2 and the third insulating layer IS-IL3.

A voltage line VL may be disposed on the peripheral area DP-NDA. The voltage line VL may be disposed on the second insulating layer 20 of the display panel DP. The voltage line VL may receive a low supply voltage. The low supply voltage may be applied to the second electrode CE. A connection electrode VL-E may be disposed on the voltage line VL, and the connection electrode VL-E may be connected to the second electrode CE. The connection electrode VL-E may be disposed on the third insulating layer 30 of the display panel DP.

A first line pattern DMP1 may at least partially overlap the voltage line VL. The first line pattern DMP1 may be in contact with the connection electrode VL-E. The first line pattern DMP1 may have the dam function in the inkjet process of forming the encapsulation organic layer OL. A second line pattern DMP2 may be disposed outside of the first line pattern DMP1, and the second line pattern DMP2 may have substantially the same function as that of the first line pattern DMP1 and may support the first line pattern DMP1.

The first line pattern DMP1 may include a first layer I1, a second layer I2, and a third layer I3. The first layer I1 may be formed of the same material as that of the fourth insulating layer 40, the second layer I2 may be formed of the same material as that of the fifth insulating layer 50, and the third layer I3 may be formed of the same material as that of the pixel definition layer PDL. The second line pattern DMP2 may further include a layer including the same material as that of the third insulating layer 30 when compared with the first line pattern DMP1. The second line pattern DMP2 may have substantially the same structure as the first line pattern DMP1 except for the presence of the additional layer.

The first encapsulation inorganic layer IOL1 and the second encapsulation inorganic layer IOL2 may at least partially overlap the first line pattern DMP1 and the second line pattern DMP2 and may be in contact with each other outside of the first line pattern DMP1. The first encapsulation inorganic layer IOL1 and the second encapsulation inorganic layer IOL2 may encapsulate the encapsulation organic layer OL. In addition, the first encapsulation inorganic layer IOL1 may be in contact with the second insulating layer 20, which is the inorganic layer, outside of the second line pattern DMP2. The first encapsulation inorganic layer IOL1 and the second insulating layer 20 may encapsulate the organic layer interposed therebetween.

The crack sensing pattern CRD may be disposed outside of the first insulating layer 10 and the second insulating layer 20. The crack sensing pattern CRD may include a first layer including the same material as that of the first insulating layer 10 and a second layer including the same material as that of the second insulating layer 20. The crack sensing pattern CRD including the inorganic material may sense a crack that expands from an edge of the display panel DP.

The scan driving circuit GDC may be disposed between the voltage line VL and the display area DP-DA. A transistor TR-D and a signal line VL-int, which are components of the scan driving circuit GDC, are shown as a representative example. The scan driving circuit GDC may include a plurality of stage circuits each of which generates the scan signal, and the stage circuit may include a plurality of transistors. FIG. 5B shows one transistor TR-D as a representative example.

The transistor TR-D of the scan driving circuit GDC may be formed through the same process as the transistor TR-P of the pixel circuit. The transistor TR-D of the scan driving circuit GDC may have the same stack structure as that of the transistor TR-P of the pixel circuit. The signal line VL-int may receive a clock signal or the bias voltage.

According to an embodiment, the organic pattern ORP may be disposed on the thin film encapsulation layer TFE and may at least partially overlap the peripheral area DP-NDA. Since the liquid organic material used to form the encapsulation organic layer OL is uniformly provided in the display area DP-DA, the encapsulation organic layer OL may provide a relatively flat upper surface in the display area DP-DA. An inclined surface may be naturally formed in an area adjacent to the first line pattern DMP1 while the liquid organic material is being spread outward. The liquid organic material may be cured, and thus, the encapsulation organic layer OL having the inclined surface may be formed. For example, in the peripheral area DP-NDA, a thickness of a portion of the encapsulation organic layer OL adjacent to the display area DP-DA may be greater than a thickness of a portion of the encapsulation organic layer OL farther away from the display area DP-DA.

Since the encapsulation organic layer OL is not disposed outside of the first line pattern DMP1, a step difference or a curved portion may be formed between the peripheral area DP-NDA and the display area DP-DA. The step difference between the peripheral area DP-NDA and the display area DP-DA may be compensated for by the organic pattern ORP.

Referring to FIGS. 5A and 5B, the first signal line SL1 may at least partially overlap the line patterns DMP1 and DMP2. The organic pattern ORP may provide a flat upper surface and may support the first signal line SL1 in an area in which the line patterns DMP1 and DMP2 are formed.

FIG. 5B shows the first signal line SL1 including the line SL1-1 of the first layer and the line SL1-2 of the second layer connected to the line SL1-1 via the contact hole TH-O as a representative example.

FIG. 5C shows the components of the display module DM schematically as compared with FIG. 5B, and the second encapsulation inorganic layer IOL2 and the insulating layers IS-ILL IS-IL2, and IS-IL3 of the input sensor ISL are understood to be at least similar to corresponding elements depicted and described elsewhere within the figures and specification. In addition, the first signal line SL1 is shown as a single-layer structure. The circuit element layer DP-CL and the display element layer DP-OLED are schematically shown.

Referring to FIGS. 5B and 5C, the organic pattern ORP may include a first portion ORP1 disposed outside of the first line pattern DMP1 and a second portion ORP2 disposed inside of the first line pattern DMP1 and at least partially overlapping the encapsulation organic layer OL. The portion of the organic pattern ORP at least partially overlapping the first line pattern DMP1 may be defined as a portion of the first portion ORP1 or a portion of the second portion ORP2 and may be disregarded since it has a relatively small size.

In an embodiment, the organic pattern ORP may be in contact with the second inorganic layer IOL2. The organic pattern ORP may be formed after the second inorganic layer IOL2 is formed.

The first portion ORP1 may have an area greater than that of the second portion ORP2. Referring to FIGS. 5B and 5C, the first portion ORP1 is disposed in the area where the first signal line SL1 is disposed and also in the area around the first signal line SL1. The second portion ORP2 is disposed in the area where the first signal line SL1 is disposed. Since the second portion ORP2 corresponds to a bridge supporting the first signal line SL1, it is sufficient to secure an area supporting the first signal line SL1.

As the second portion ORP2 is patterned and is discontinuous in the first direction DR1, a tensile force on the organic pattern ORP may be reduced even though the tensile force occurs when the display module DM is rolled as shown in FIGS. 1A and 1B. The organic pattern ORP may be applied not only to a rollable display device but also to a foldable display device on which the tensile force occurs.

Since the first portion ORP1 is disposed in an area in which the encapsulation organic layer OL, having a relatively great thickness compared with the first encapsulation inorganic layer IOL1, is disposed and also where the second encapsulation inorganic layer IOL2 is not disposed, the first portion ORP1 may have a greater thickness than that of the second portion ORP2. An average thickness of the first portion ORP1 may be comparable to an average thickness of the second portion ORP2.

The organic pattern ORP may be disposed between the peripheral area DP-NDA and the display area DP-DA to prevent a height difference from occurring between the peripheral area DP-NDA and the display area DP-DA on the layer where the first signal line SL1 is disposed. The first signal line SL1 may extend from the sensing electrode (referred to as the sensing portion SP1 in FIG. 5C) and may be parallel to the sensing electrode by the organic pattern ORP. As a result, a distance between the second electrode CE and the first signal line SL1 might not be reduced in an inclined area of the encapsulation organic layer OL. A coupling between the second electrode CE and the first signal line SL1 may be uniformly maintained regardless of the shape of the encapsulation organic layer OL.

The organic pattern ORP may include a negative-type photosensitive organic material, and the shape and the thickness of the organic pattern ORP may be controlled depending on a masking process. A portion of an organic layer, which is fully exposed, may exist as the first portion ORP1, and a portion of the organic layer whose exposure amount is adjusted by a slit region of a halftone mask may exist as the second portion ORP2. A portion of the organic layer, which is not exposed, may be removed. A positive-type photosensitive organic material may be exposed in a manner opposite to that of the negative-type photosensitive organic material to form the organic pattern.

The first signal line SL1 may include a first line portion SL10 extending in the first direction DR1 and a second line portion SL20 extending in the second direction DR2 from the first line portion SL10. The first line portion SL10 may be supported by the first portion ORP1, and the second line portion SL20 may be supported by the second portion ORP2. Since the second portion ORP2 has a small thickness compared to that of the second portion ORP2, the second portion ORP2 may provide a substantially flat surface with the first portion ORP1 even though the second portion ORP2 at least partially overlaps the encapsulation organic layer OL.

The first line portion SL10 may be disposed outside of the encapsulation organic layer OL. The first signal line SL1 shown in FIG. 5B corresponds to the first line portion SL10 of FIG. 5C. The first line portion SL10 might not overlap the second electrode CE. The coupling between the second electrode CE and the first signal line SL1 may be reduced.

Figure 5D:
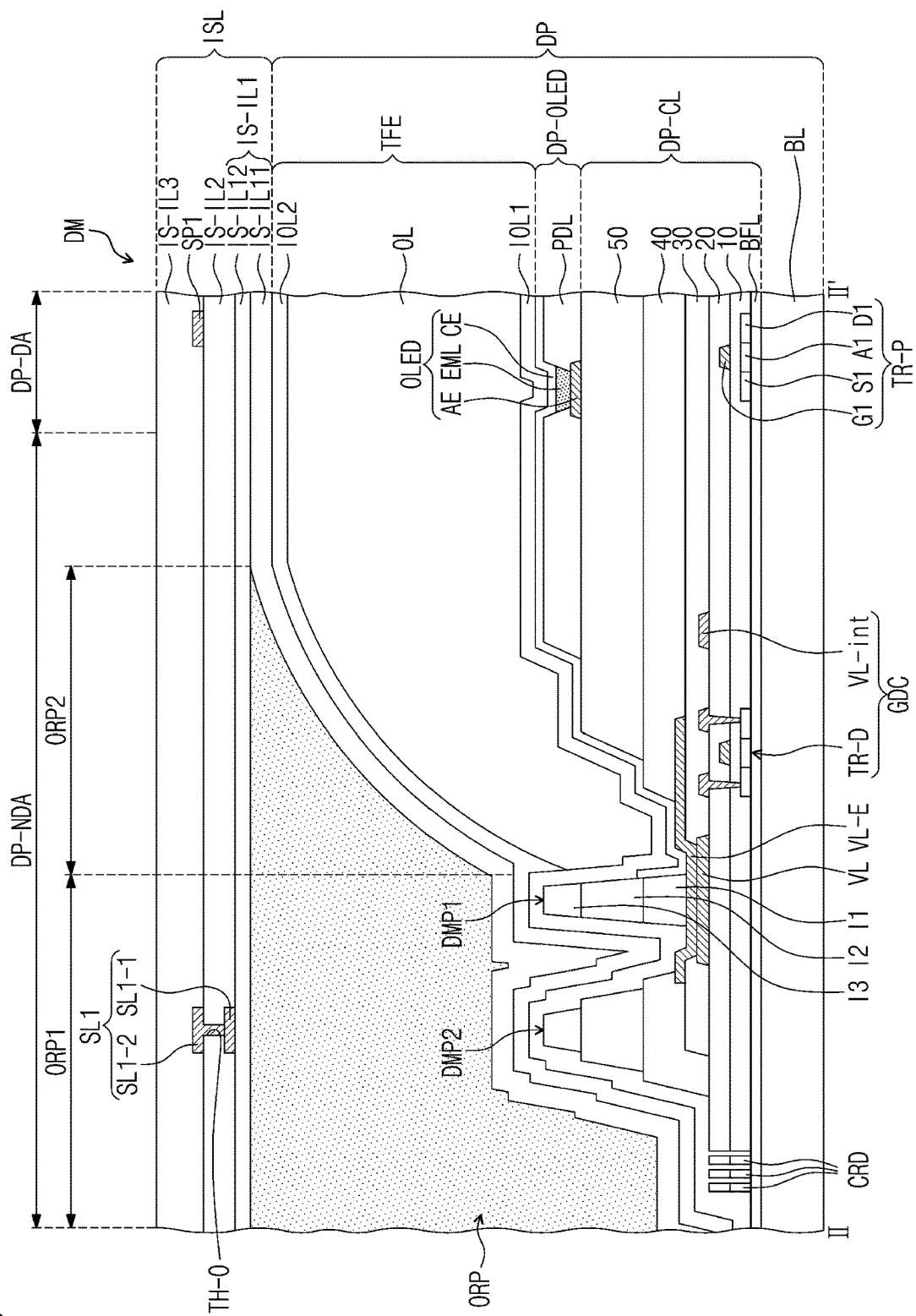
FIG. 5D is a cross-sectional view of a display module according to an embodiment of the present disclosure.

Referring to FIG. 5D, the first insulating layer IS-IL1 of the input sensor ISL may have a multi-layer structure. The first insulating layer IS-IL1 may include a first inorganic layer IS-IL11 and a second inorganic layer IS-IL12 disposed on the first inorganic layer IS-IL11. Each of the first inorganic layer IS-IL11 and the second inorganic layer IS-IL12 may include silicon oxide, silicon oxynitride, silicon nitride, zirconium oxide, aluminum oxide, titanium oxide, and/or hafnium oxide. The organic pattern ORP may be disposed between the first inorganic layer IS-IL11 and the second inorganic layer IS-IL12.

According to an embodiment, the organic pattern ORP may be disposed under the line SL1-1 of the first layer of FIG. 5B, and the organic pattern ORP may be in contact with the line SL1-1 of the first layer and may support the line SL1-1 of the first layer. In this case, the first insulating layer IS-IL1 may have a single-layer or multi-layer structure.

Figure 6A:
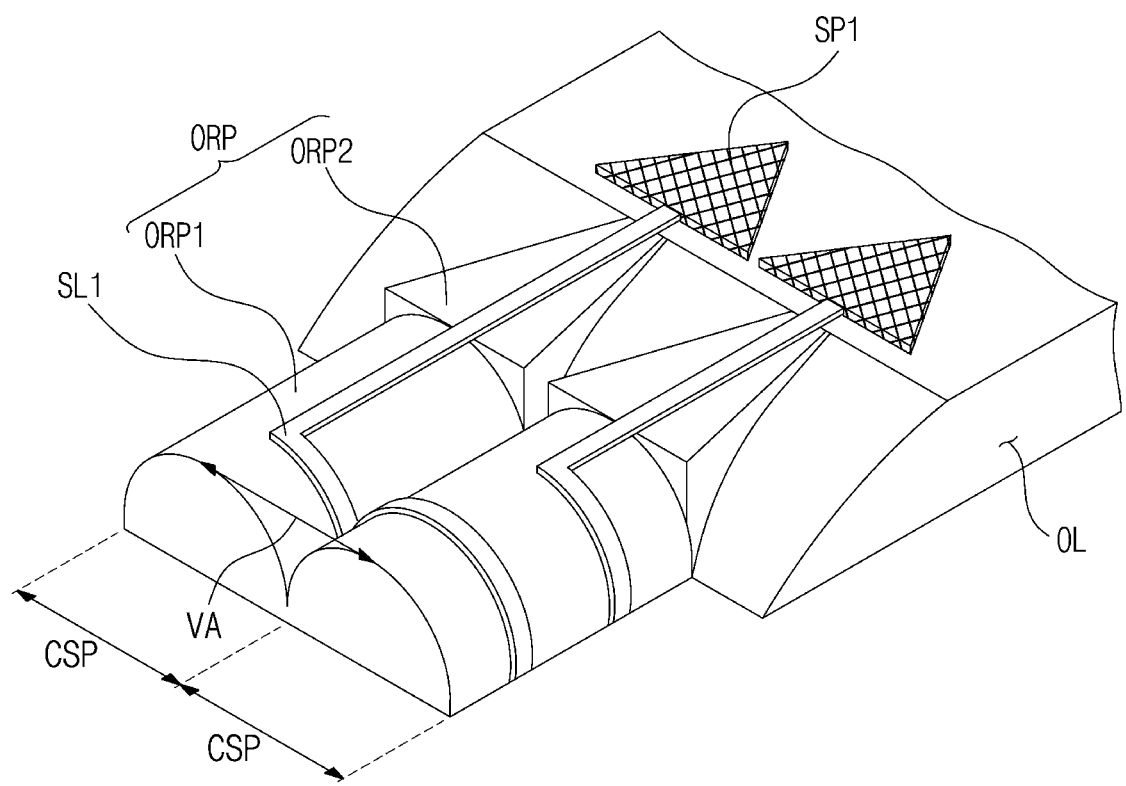
FIGS. 6A to 6C are partial perspective views of an organic pattern according to an embodiment of the present disclosure.
Figure 6B:
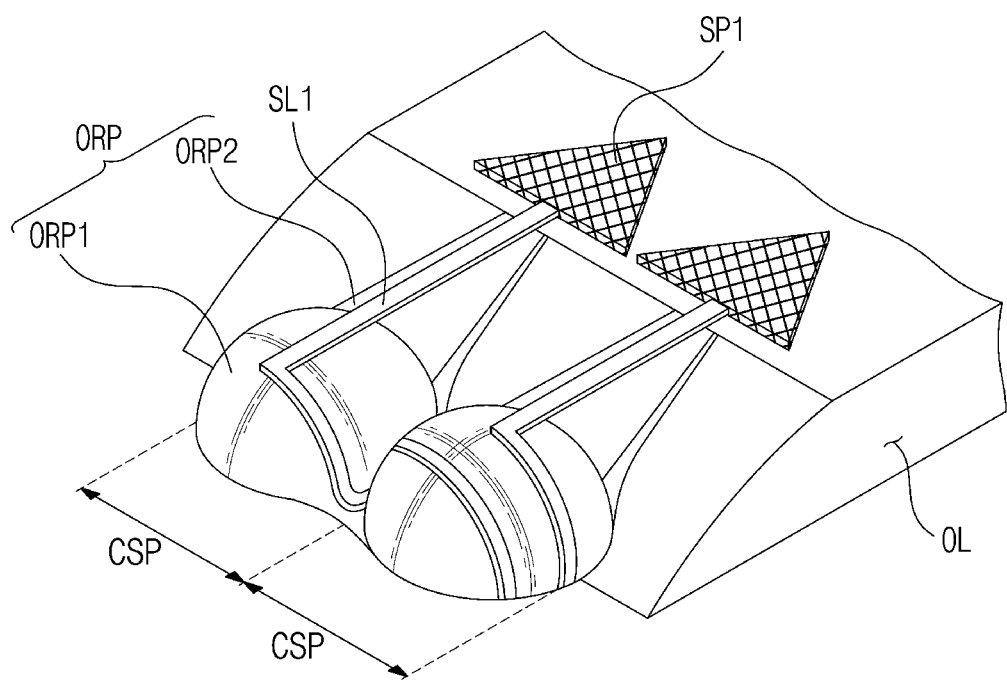
Figure 6C:
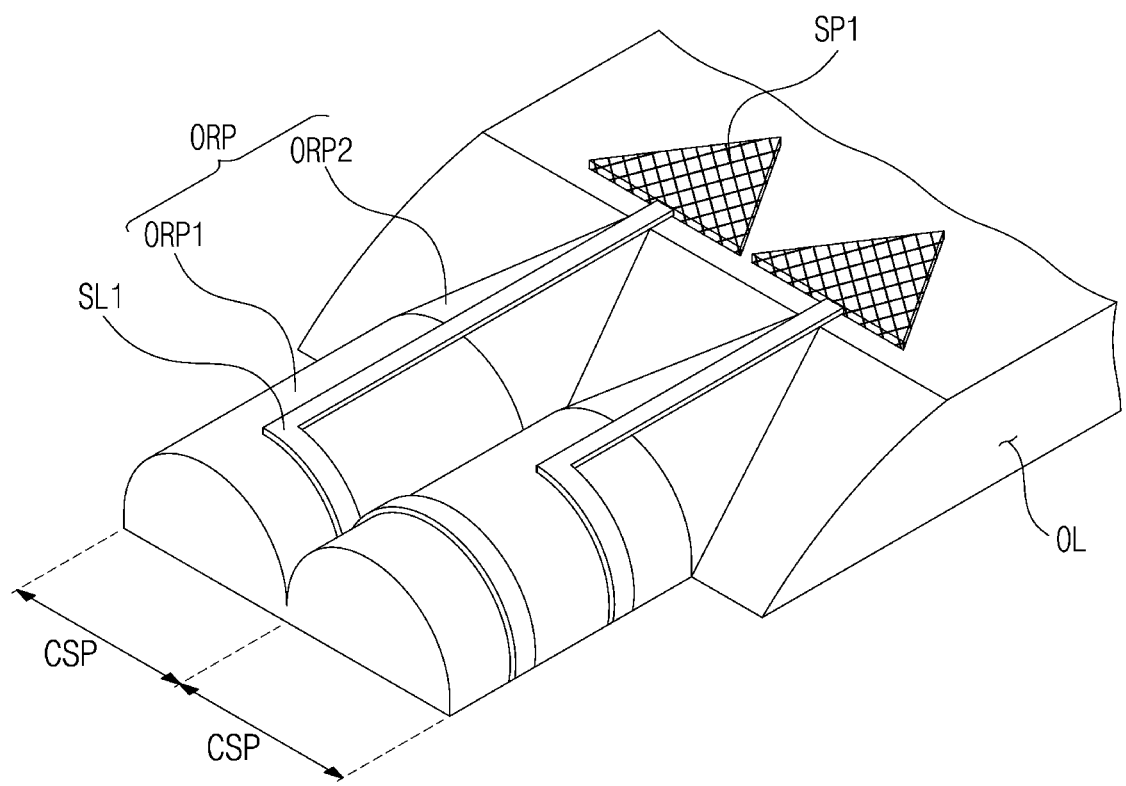

FIGS. 6A to 6C are partial perspective views of organic patterns ORP according to embodiments of the present disclosure. Elements depicted in these figures that are not described in detail herein may be understood to be at least similar to corresponding elements that have been described elsewhere within the present disclosure.

Referring to FIGS. 6A to 6C, each of first portions ORP1 may include curved surface patterns CSP arranged in the first direction DR1. Each of the curved surface patterns may provide a convex curved surface. Even though the tensile force occurs when the display module DM is rolled as shown in FIGS. 1A and 1B, the curved surface patterns may reduce the tensile force on the organic pattern ORP. The curved surface patterns CSP may be applied not only to a rollable display device but also to a foldable display device on which the tensile force occurs.

Referring to FIG. 6A, the curved surface pattern CSP may provide a curved surface such as a semi-cylindrical shape. The organic pattern ORP shown in FIG. 6A may be described as including the valley area VA defined therein.

FIG. 6A shows one valley area VA as a representative example, however, a plurality of valley areas VA may be arranged in the first direction DR1. The valley area VA may extend in the second direction DR2 crossing the first direction DR1.

Referring to FIG. 6B, the curved surface pattern CSP may provide a curved surface such as a hemisphere shape. Referring to FIG. 6C, the second portion ORP2 may provide a convex curved surface rather than a flat surface. The second portion ORP2 may have a half cone shape.

As shown in FIGS. 6A to 6C, the organic pattern ORP may include a dye or a pigment. The organic pattern ORP having a predetermined color may prevent a structure disposed under the organic pattern ORP from being viewed.

Figure 7A:
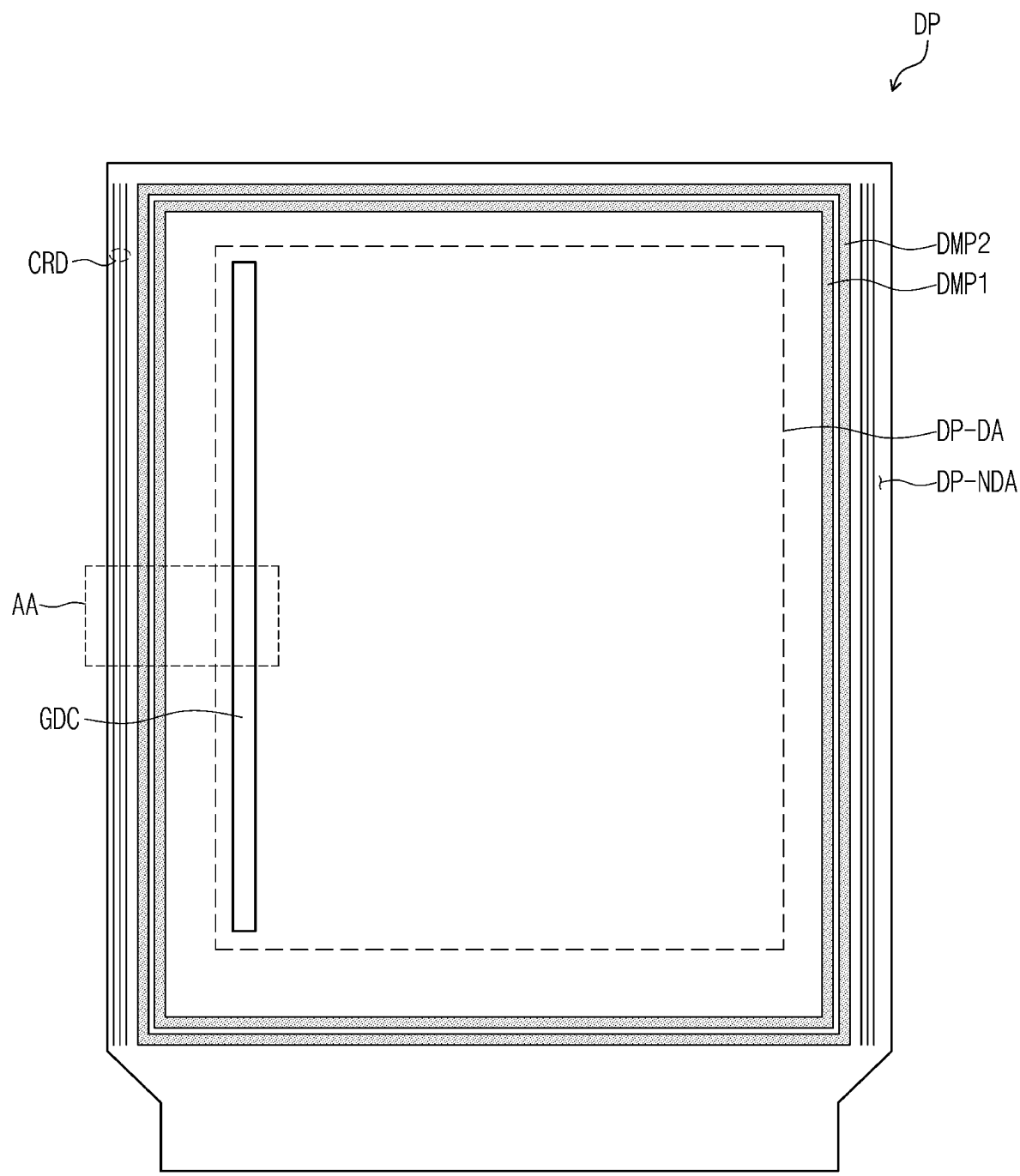
FIG. 7A is a plan view of a display panel according to an embodiment of the present disclosure.
Figure 7B:
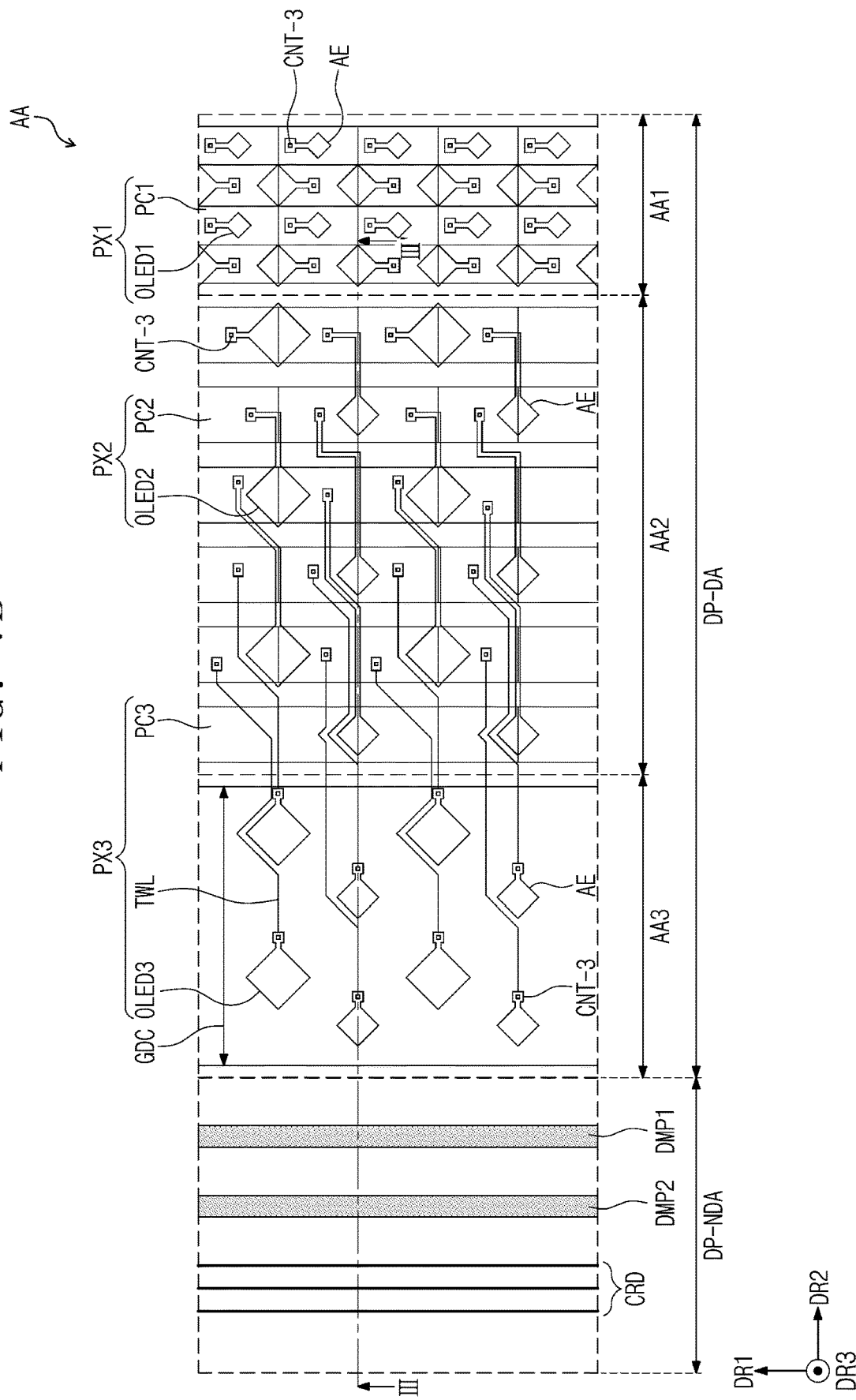
FIG. 7B is an enlarged plan view of a portion of the display panel of FIG. 7A.
Figure 7C:
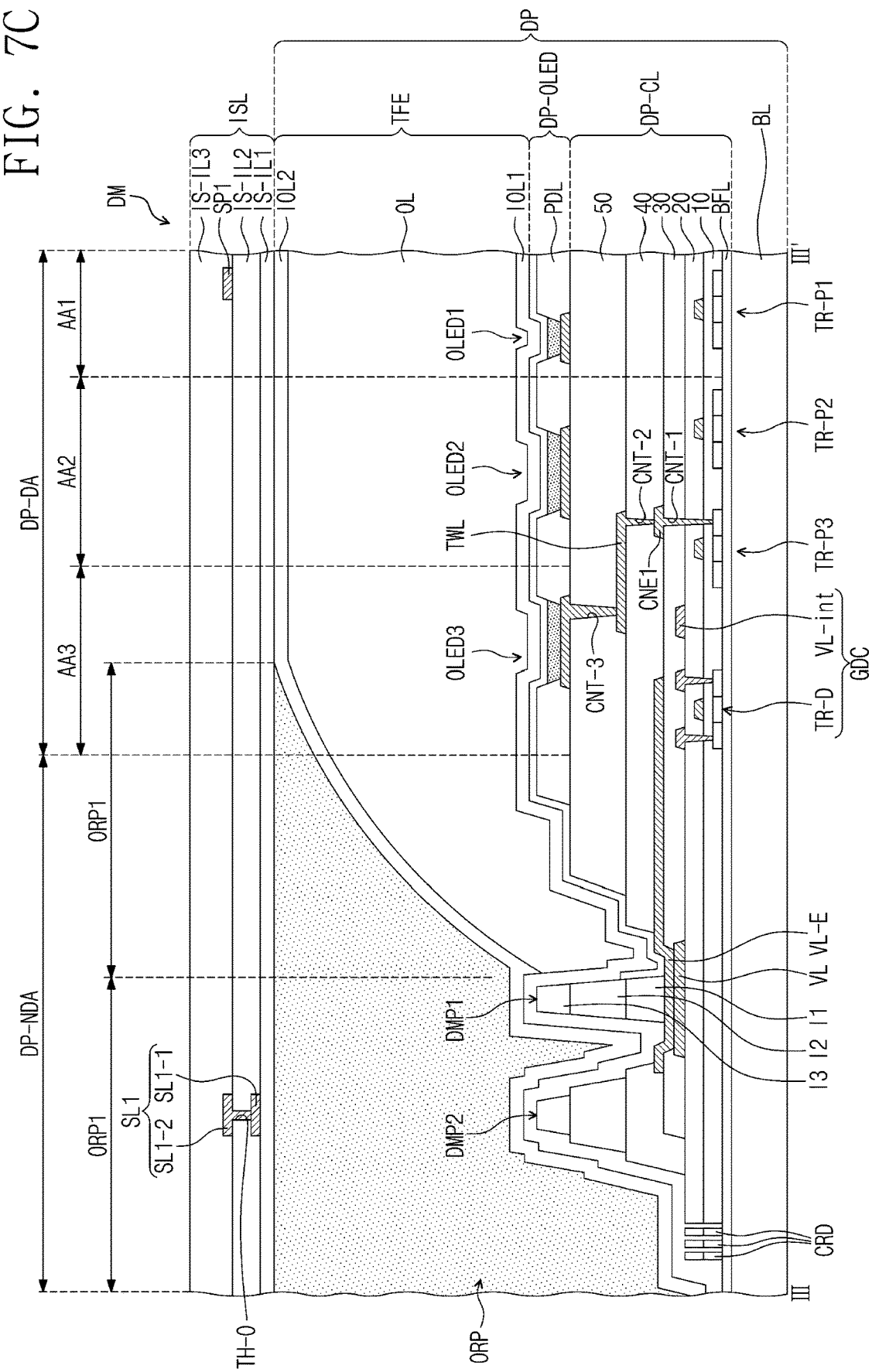
FIG. 7C is a cross-sectional view taken along a line of FIG. 7B.
Figure 7D:
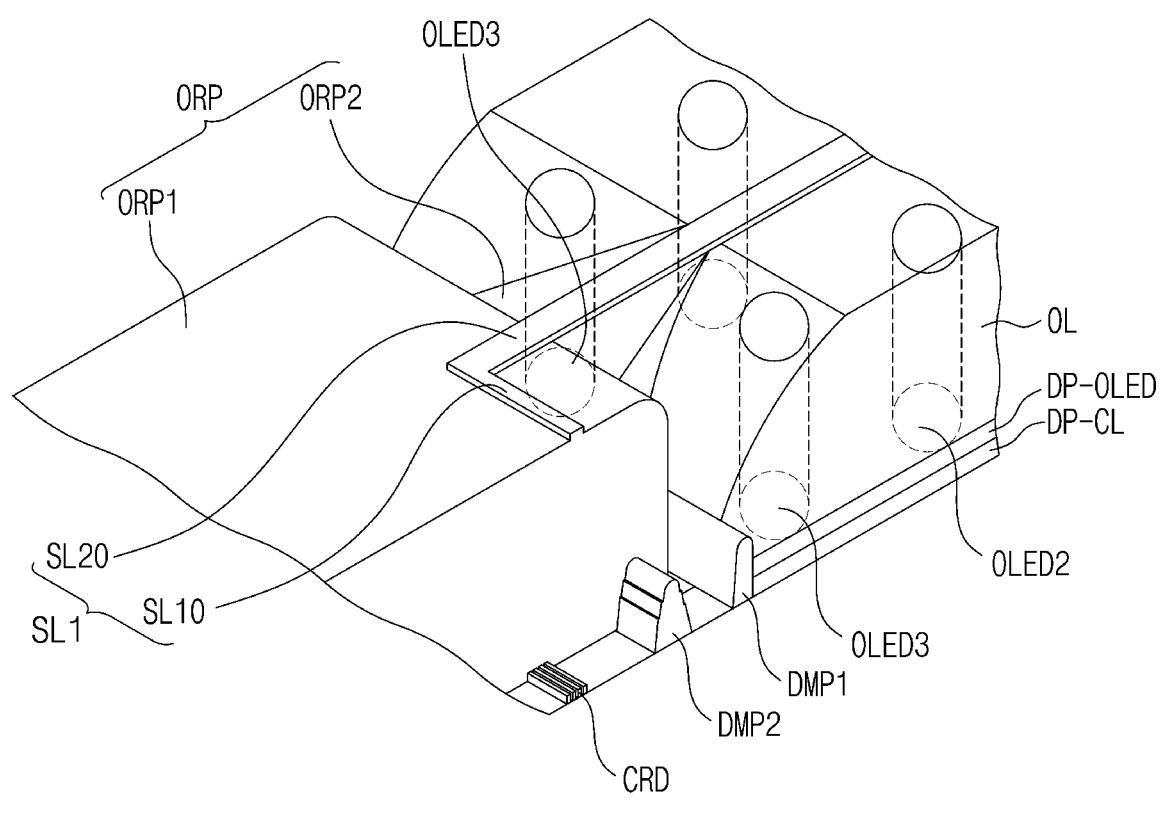
FIG. 7D is a partial perspective view of an organic pattern and a signal line.
Figure 7E:
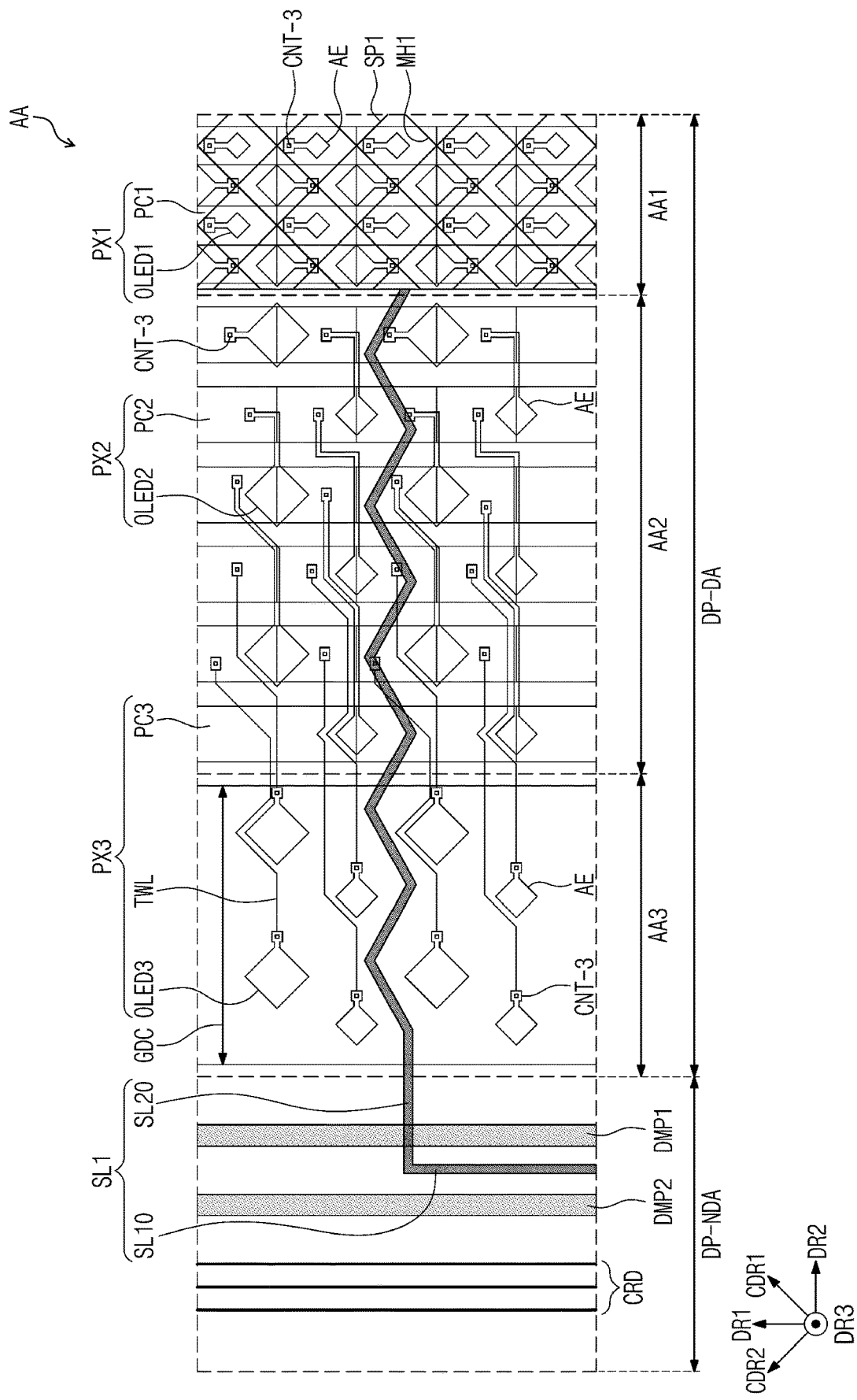
FIGS. 7E to 7G are plan views of a portion of an input sensor at least partially overlapping a portion of the display panel shown in FIG. 7B.
Figure 7F:
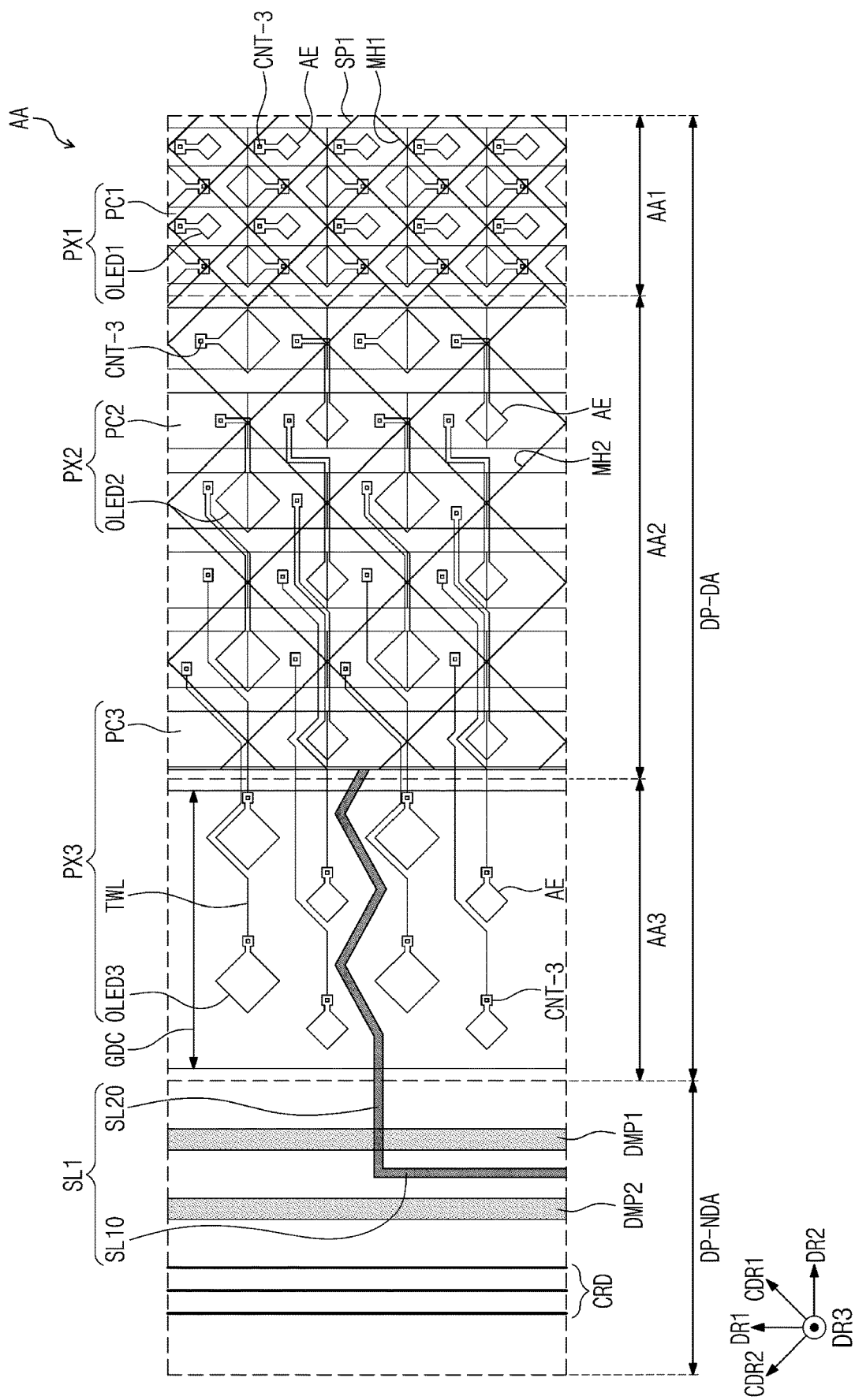
Figure 7G:
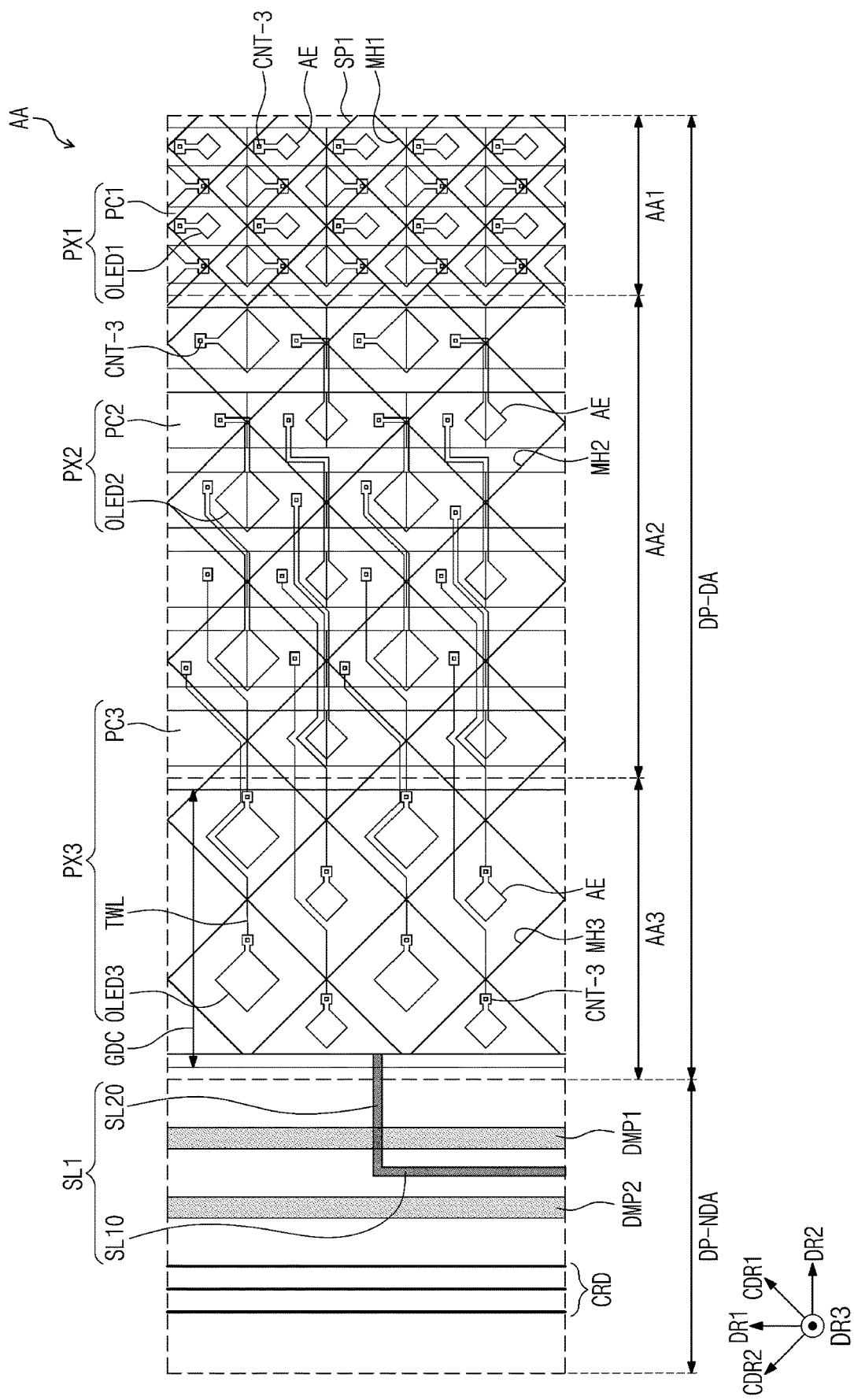

FIG. 7A is a plan view of a display panel DP according to an embodiment of the present disclosure. FIG. 7B is an enlarged plan view of a portion AA of the display panel DP of FIG. 7A. FIG. 7C is a cross-sectional view taken along a line of FIG. 7B. FIG. 7D is a partial perspective view of an organic pattern ORP and a signal line SL1. FIGS. 7E to 7G are plan views of a portion of an input sensor ISL at least partially overlapping the portion AA of the display panel DP shown in FIG. 7B.

Referring to FIG. 7A, a scan driving circuit GDC may at least partially overlap a display area DP-DA. Accordingly, an area for the scan driving circuit GDC is unnecessary in a peripheral area DP-NDA, and the area of the peripheral area DP-NDA may be reduced.

Referring to FIG. 7B, the display area DP-DA may include a first display area AA1, a second display area AA2 outside of the first display area AA1, and a third display area AA3 outside of the second display area AA2. The peripheral area DP-NDA may be defined outside of the third display area AA3.

A first pixel PX1 may be disposed in the first display area AA1, and a second pixel PX2 may be disposed in the second display area AA2. A third pixel PX3 may be disposed in the second display area AA2 and the third display area AA3. Each of the first pixel PX1, the second pixel PX2, and the third pixel PX3 may be provided in plural. Each of the first pixel PX1, the second pixel PX2, and the third pixel PX3 may include a red pixel, a green pixel, and a blue pixel and may further include a white pixel.

The first pixel PX1 may include a first light emitting element OLED1 disposed in the first display area AA1 and a first pixel circuit PC1 electrically connected to the first light emitting element OLED1 and disposed in the first display area AA1. The second pixel PX2 may include a second light emitting element OLED2 disposed in the second display area AA2 and a second pixel circuit PC2 electrically connected to the second light emitting element OLED2 and disposed in the second display area AA2. The third pixel PX3 may include a third light emitting element OLED3 disposed in the third display area AA3 and a third pixel circuit PC3 electrically connected to the third light emitting element OLED3 and disposed in the second display area AA2.

Each of the first light emitting element OLED1, the second light emitting element OLED2, and the third light emitting element OLED3 may be substantially the same as the light emitting element OLED shown in FIG. 3, and each of the first pixel circuit PC1, the second pixel circuit PC2, and the third pixel circuit PC3 may include the transistor TR-P shown in FIG. 3. FIG. 7B shows a first electrode AE having a substantially lozenge shape as representative of the first light emitting element OLED1, the second light emitting element OLED2, and the third light emitting element OLED3.

The scan driving circuit GDC formed through the same process as the first pixel circuit PC1, the second pixel circuit PC2, and the third pixel circuit PC3 may be disposed in the third display area AA3. Accordingly, the third pixel circuit PC3 might not be disposed in the third display area AA3, and the third pixel circuit PC3 may be disposed in the second display area AA2.

Since the second pixel circuit PC2 and the third pixel circuit PC3 are disposed in the second display area AA2, the second display area AA2 may have a relatively low resolution compared to the first display area AA1. For example, the number of the pixels disposed in the second display area AA2 is smaller than the number of the pixels disposed in the first display area AA1 based on the same reference area. The third display area AA3 may also have a relatively lower resolution than that of the first display area AA1. The resolution of the second display area AA2 may be the same as the resolution of the third display area AA3.

The second light emitting element OLED2 and the third light emitting element OLED3 may have a relatively large sized area of light emission prevent a luminance degradation due to the low resolution of the second display area AA2 and the third display area AA3. When a size of an area of light emission of a first color, e.g., a red light emission size, a green light emission size, or a blue light emission size, of the second light emitting element OLED2 and the third light emitting element OLED3 has a first size, a size of an area of light emission of a first color of the first light emitting element OLED1 may have a size smaller than the first size.

Since the first electrode AE of the third light emitting element OLED3 is spaced apart from the third pixel circuit PC3 and disposed at a position at least partially overlapping the scan driving circuit GDC, the third pixel PX3 may further include a connection line TWL connecting the third light emitting element OLED3 and the third pixel circuit PC3. The connection line TWL may electrically connect the third light emitting element OLED3 disposed in the third display area AA3 to the third pixel circuit PC3 disposed in the second display area AA2. The connection line TWL may include various materials, such as a metal material, a transparent conductive oxide, a conductive polymer, etc., however, the present disclosure is not necessarily limited thereto or thereby.

Referring to FIG. 7C, one first light emitting element OLED1, one second light emitting element OLED2, and one third light emitting element OLED3 are shown as a representative example. A connection relationship between the third light emitting element OLED3 and a transistor TR-P3 of the third pixel circuit PC3 is shown as a representative example. A first connection electrode CNT-1 may be connected to a source or a drain of the transistor TR-P3 of the third pixel circuit PC3, a second connection electrode CNT-2 may be connected to the first connection electrode CNT-1, and the connection line TWL may be connected to the second connection electrode CNT-2. The first electrode of the first light emitting element OLED1 may be connected to the connection line TWL. The third light emitting element OLED3 may at least partially overlap the transistor TR-D of the scan driving circuit GDC.

Referring to FIGS. 7C and 7D, a portion of an encapsulation organic layer OL at least partially overlapping the third display area AA3 may provide an inclined surface. A second portion ORP2 of an organic pattern ORP may at least partially overlap the peripheral area DP-NDA and the third display area AA3. Referring to FIG. 7D, the second portion ORP2 of the organic pattern ORP may be disposed between the third light emitting elements OLED3 and spaced apart from each other in the first direction DR1. The second portion ORP2 of the organic pattern ORP might not overlap the third light emitting elements OLED3 and may reduce an interference against a source light generated by the third light emitting elements OLED3.

Referring to FIG. 7E, a second line portion SL20 may be disposed between the third light emitting elements OLED3 and spaced apart from each other in the first direction DR1. In addition, the second line portion SL20 may be disposed between the second light emitting elements OLED2 and spaced apart from each other in the first direction DR1. The second line portion SL20 might not overlap the third light emitting elements OLED3 and the second light emitting elements OLED2 and may reduce an interference against a source light generated by the third light emitting elements OLED3 and the second light emitting elements OLED2.

Referring to FIG. 7E, a sensing portion SP1 may at least partially overlap the first display area AA1. The sensing portion SP1 may be provided with a plurality of first openings MH1 defined therethrough to correspond to the first light emitting elements OLED1. Each of the first openings MH1 may have a size that is greater than that of the opening OP (refer to FIG. 3) corresponding to the first light emitting element OLED1. The sensing portion SP1 may include conductive lines extending in a first diagonal direction CDR1 and a second diagonal direction CDR2, which crosses the first direction DR1 and the second direction DR2.

Referring to FIG. 7F, the sensing portion SP1 may at least partially overlap the second display area AA2. The sensing portion SP1 may be provided with a plurality of second openings MH2 defined therethrough to correspond to the second light emitting elements OLED2. Each of the second openings MH2 may have a size that is greater than that of the opening OP (refer to FIG. 3) corresponding to the second light emitting element OLED2. The second opening MH2 may have a size that is greater than a size of the first opening MH1.

Referring to FIG. 7G, the sensing portion SP1 may at least partially overlap the third display area AA3. The sensing portion SP1 may be provided with a plurality of third openings MH3 defined therethrough to correspond to the third light emitting elements OLED3. Each of the third openings MH3 may have a size that is greater than that of the opening OP (refer to FIG. 3) corresponding to the third light emitting element OLED3. The third opening MH3 may have substantially the same size as that of the opening OP corresponding to the third light emitting element OLED3.

Although embodiments of the present disclosure have been described, it is understood that the present disclosure is not necessarily limited to these embodiments but various changes and modifications can be made by one ordinary skilled in the art within the spirit and scope of the present disclosure.

What is claimed is:

1. A display device, comprising:
   a display panel comprising a display area and a peripheral area at least partially surrounding the display area;
   a sensing electrode disposed on the display panel and at least partially overlapping the display area;
   a signal line disposed on the display panel, at least partially overlapping the peripheral area, and connected to the sensing electrode; and
   an organic pattern disposed on the display panel and at least partially overlapping the signal line,
   wherein the display panel comprises:
      a pixel disposed in the display area;
      a first line pattern at least partially overlapping the peripheral area;
      a first encapsulation inorganic layer disposed in both the display area and the peripheral area at least partially overlapping both the first line pattern and the pixel;
      an encapsulation organic layer disposed on the first encapsulation inorganic layer and disposed inside the first line pattern; and
      a second encapsulation inorganic layer disposed on the encapsulation organic layer, at least partially overlapping the display area and the peripheral area, and being in contact with the first encapsulation inorganic layer in the peripheral area,
   wherein the organic pattern comprises:
      a first portion disposed beyond the first line pattern; and
      a second portion disposed inside the first line pattern and at least partially overlapping the encapsulation organic layer, and
   wherein the organic pattern does not overlap the encapsulation organic layer at a highest level thereof, relative to a base layer of the display panel, in a cross-sectional view, and
   wherein the first line pattern extends in a first direction, the signal line comprises a first line portion extending in a first direction and a second line portion extending from the first line portion in a second direction crossing the first direction, and the second line portion at least partially overlaps the second portion.

2. The display device of claim 1, wherein the second portion has a size smaller than a size of the first portion.

3. The display device of claim 1, wherein the first portion has an average thickness greater than an average thickness of the second portion.

4. The display device of claim 1, wherein the display panel further comprises a second line pattern disposed beyond the first line pattern.

5. The display device of claim 1, wherein a portion of the encapsulation organic layer adjacent to the display area in the peripheral area has a thickness greater than a thickness of a portion of the encapsulation organic layer farther from the display area.

6. The display device of claim 1, wherein the first line portion is disposed outside of the encapsulation organic layer.

7. The display device of claim 1, wherein the first line pattern extends in a first direction, the first portion extends in the first direction, and the first portion comprises a plurality of curved surface patterns arranged in the first direction and providing a convex curved surface.

8. The display device of claim 7, wherein the second portion is provided in plural, and each of the plurality of second portions is spaced apart from neighboring second portions, of the plurality of second portions, in the first direction.

9. The display device of claim 1, wherein the first line pattern extends in a first direction, the first portion extends in the first direction, and the first portion comprises a plurality of valley areas defined therein, spaced apart from each other in the first direction, and extending in a second direction crossing the first direction.

10. The display device of claim 1, wherein the organic pattern further comprises a dye or a pigment.

11. The display device of claim 1, wherein the organic pattern is in contact with the second encapsulation inorganic layer.

12. The display device of claim 1, further comprising:
a first inorganic layer disposed on the second encapsulation inorganic layer; and
a second inorganic layer disposed on the first inorganic layer,
wherein the organic pattern is disposed between the first inorganic layer and the second inorganic layer.

13. The display device of claim 1, further comprising:
a first inorganic layer disposed on the second encapsulation inorganic layer; and
a second inorganic layer disposed on the first inorganic layer,
wherein the signal line comprises a line of a first layer disposed between the first inorganic layer and the second inorganic layer and a line of a second layer disposed on the second inorganic layer and connected to the line of the first layer via a contact bole defined through the second inorganic layer.

14. The display device of claim 1, wherein the display area comprises a first display area, a second display area disposed outside of the first display area, and a third display area disposed outside of the second display area,
wherein the pixel comprises:
a first pixel comprising a first light emitting element disposed in the first display area and a first pixel circuit electrically connected to the first light emitting element and disposed in the first display area;
a second pixel comprising a second light emitting element disposed in the second display area and a second pixel circuit electrically connected to the second light emitting element and disposed in the second display area; and
a third pixel comprising a third light emitting element disposed in the third display area and a third pixel circuit electrically connected to the third light emitting element and disposed in the second display area.

15. The display device of claim 14, wherein the display panel further comprises a scan driving circuit providing a scan signal to the first pixel, the second pixel, and the third pixel,
wherein the scan driving circuit at least partially overlaps the third display area, and the third light emitting element at least partially overlaps the scan driving circuit.

16. The display device of claim 14, wherein the first line pattern extends in a first direction, the third light emitting element is provided in plural, and the second portion is disposed between two neighboring third light emitting elements, of the plurality of third light emitting elements.

17. The display device of claim 14, wherein the first display area has a resolution that is greater than a resolution of the second display area or a resolution of the third display area.

18. The display device of claim 17, wherein a size of an area of light emission of a first color of the second light emitting element is greater than a size of an area of light emission of the first color of the first light emitting element.

19. A display device, comprising:
a display panel comprising a display area and a peripheral area disposed proximate to the display area;
a sensing electrode disposed on the display panel and at least partially overlapping the display area;
a signal line disposed on the display panel, at least partially overlapping the peripheral area, and connected to the sensing electrode; and
an organic pattern disposed on the display panel and supporting the signal line,
wherein the display panel comprises:
a light emitting element at least partially overlapping the display area;
a first line pattern at least partially overlapping the peripheral area;
a first encapsulation inorganic layer disposed in both the display area and the peripheral area and at least partially overlapping the light emitting element;
an encapsulation organic layer disposed on the first encapsulation inorganic layer and having an inclined surface; and
a second encapsulation inorganic layer disposed on the encapsulation organic layer and contacting the first encapsulation inorganic layer in the peripheral area,
wherein the organic pattern comprises:
a first portion that does not overlap the encapsulation organic layer; and
a second portion at least partially overlapping the inclined surface of the encapsulation organic layer and stopping at a top portion of the encapsulation organic layer, and
wherein the first line pattern extends in a first direction, the signal line comprises a first line portion extending in the first direction and a second line portion extending from the first line portion in a second direction crossing the first direction, and the second line portion at least partially overlaps the second portion.

20. A display device, comprising:
a display panel including a display area, a non-display area proximate to the display area, and a raised dam disposed within the non-display area and having a substantially closed loop shape;
a sensing electrode disposed on the display area of the display panel;
a sensing electrode signal line electrically connected to the sensing electrode; and
an organic pattern disposed on the display panel and at least partially overlapping the sensing electrode signal line,
wherein the organic pattern comprises:
a first potion disposed beyond the raised dam; and
a second portion disposed within the substantially closed loop shape of the raised dam,
wherein the sensing electrode signal line is disposed beyond the closed loop shape of the raised dam,
wherein the sensing electrode signal line crosses the closed loop shape of the raised dam over an organic pattern that bridges a level of the sensing electrode signal line to that of the sensing electrode, and
wherein the raised dam extends in a first direction, the sensing electrode signal line comprises a first line portion extending in the first direction and a second line portion extending from the first line portion in a second direction crossing the first direction, and the second line portion at least partially overlaps the second portion.

21. The display device of claim 20, further comprising:
a first encapsulation inorganic layer at least partially overlapping the raised dam;
an encapsulation organic layer disposed on the first encapsulation inorganic layer and disposed within the raised dam; and a second encapsulation inorganic layer disposed on the encapsulation organic layer and contacting the first encapsulation inorganic layer in the non-display area.

22. The display device of claim 21, wherein the second portion at least partially overlapping the encapsulation organic layer.

* * * * *